(12) United States Patent
Grangetto et al.

(10) Patent No.: US 10,708,601 B2
(45) Date of Patent: Jul. 7, 2020

(54) METHODS AND APPARATUSES FOR ENCODING AND DECODING SUPERPIXEL BORDERS

(71) Applicant: SISVEL TECHNOLOGY S.R.L., None (IT)

(72) Inventors: Marco Grangetto, Pinerolo (IT); Francesco Verdoja, Helsinki (FI)

(73) Assignee: Sisvel Technology S.R.L., None (IT)

( * ) Notice: Subject to any disclaimer, the term of this patent is extended or adjusted under 35 U.S.C. 154(b) by 0 days.

(21) Appl. No.: 16/488,879

(22) PCT Filed: Mar. 2, 2018

(86) PCT No.: PCT/IB2018/051339
§ 371 (c)(1),
(2) Date: Aug. 26, 2019

(87) PCT Pub. No.: WO2018/158738
PCT Pub. Date: Sep. 7, 2018

(65) Prior Publication Data
US 2020/0014937 A1    Jan. 9, 2020

(30) Foreign Application Priority Data

Mar. 3, 2017    (IT) .................. 102017000024221

(51) Int. Cl.
*H04N 19/00*    (2014.01)
*H04N 19/167*    (2014.01)
(Continued)

(52) U.S. Cl.
CPC .......... *H04N 19/167* (2014.11); *G06T 15/00* (2013.01); *G06T 17/00* (2013.01); *H04N 19/103* (2014.11); *H04N 19/182* (2014.11)

(58) Field of Classification Search
CPC . G06T 15/00; G06T 17/00; G06T 1/00; G06F 17/00; G06F 9/00; G06F 3/00; G09G 5/00; H04N 5/00; H04N 19/00
See application file for complete search history.

(56) References Cited

U.S. PATENT DOCUMENTS

| 2008/0137961 A1 | 6/2008 | Ishida et al. | |
| 2011/0206288 A1* | 8/2011 | Lee | H04N 19/597 382/233 |

(Continued)

FOREIGN PATENT DOCUMENTS

JP    S58-018775    2/1983

OTHER PUBLICATIONS

International Preliminary Report on Patentability dated Sep. 3, 2019, issued in PCT Application No. PCT/IB2018/051339, filed Mar. 2, 2018.

(Continued)

*Primary Examiner* — Maryam A Nasri
(74) *Attorney, Agent, or Firm* — Workman Nydegger

(57) ABSTRACT

The present invention relates to a method for encoding the borders of pixel regions of an image, wherein the borders contain a sequence of vertices subdividing the image into regions of pixels (superpixels), by generating a sequence of symbols from an alphabet including the step of: defining for each superpixel a first vertex for coding the borders of the superpixel according to a criterion common to all superpixels; defining for each superpixel the same coding order of the border vertices, either clockwise or counter-clockwise; defining the order for coding the superpixels on the base of a common rule depending on the relative positions of the first vertices; defining a set of vertices as a known border, wherein the following steps are performed for selecting a symbol of the alphabet, for encoding the borders of the superpixels: a) determining the first vertex of the next (Continued)

superpixel border individuated by the common criterion; b) determining the next vertex to be encoded on the basis of the coding direction; c) selecting a first symbol ("0") for encoding the next vertex if the next vertex of a border pertains to the known border, d) selecting a symbol ("1"; "2") different from the first symbol ("0") if the next vertex is not in the known border; e) repeating steps b), c), d) and e) until all vertices of the superpixel border have been encoded; f) adding each vertex of the superpixel border that was not in the known border to the set; g) determining the next superpixel whose border is to be encoded according to the common rule, if any; i) repeating steps a)-g) until the borders of all the superpixels of the image have being added to the known border.

17 Claims, 14 Drawing Sheets

(51) Int. Cl.
*H04N 19/103* (2014.01)
*H04N 19/182* (2014.01)
*G06T 15/00* (2011.01)
*G06T 17/00* (2006.01)

(56) References Cited

U.S. PATENT DOCUMENTS

2015/0254873 A1  9/2015 Cox
2019/0304184 A1* 10/2019 Wrotek ................. G06T 17/205

OTHER PUBLICATIONS

International Search Report dated Jun. 6, 2018, issued in PCT Application No. PCT/IB2018/051339, filed Mar. 2, 2018.
Written Opinion dated Jun. 6, 2018, issued in PCT Application No. PCT/IB2018/051339, filed Mar. 2, 2018.
Herbert Freeman, *On the Encoding of Arbitrary Geometric Configurations*, IRE Transactions on Electronic Computers, vol. EC-10, No. 2, Jun. 30, 1961, pp. 260-268.
Yong Kui Liu et al., *An Efficient chain Code with Huffman Coding*, Pattern Recognition, vol. 38, No. 4, Apr. 30, 2005, pp. 553-557.
Hermilo Sanchez-Cruz et al., *Compressing Bilevel Images by Means of a Three-bit Chain Code*, Optical Engineering, vol. 44, No. 9, Sep. 2005, pp. 8.
Data Compression, Digital Document Processing, Jan. 1, 1983, pp. 116-144, XP000885329.
Pablo Arbelaez et al., *Contour Detection and Hierarchical Image Segmentation*, IEEE Transactions on Pattern Analysis and Machine Intelligence, vol. 33, No. 5, May 2011, pp. 898-916.
Hermilo Sanchez-Cruz et al., *Efficiency of Chain Codes to Represent Binary Objects*, Science Direct, Pattern Recognition, vol. 40, 2007, pp. 1160-1674.
Pedro F. Felzenszwalb et al., *Efficient Graph-Based Image Segmentation*, International Journal of Computer Vision, vol. 59, No. 2, Sep. 2004, pp. 26.
Jianbo Shi et al., *Normalized Cuts and Image Segmentation*, IEEE Transactions on Pattern Analysis and Machine Intelligence, vol. 22, No. 3, Aug. 2000, pp. 888-905.
Radhakrishna Achanta et al., *SLIC Superpixels*, EPFL Technical Report 149300, Jun. 2010, pp. 15.
Giulia Francastoro et al., *Superpixel-Driven Graph Transform for Image Compression*, 2015 IEEE, pp. 2631-2635.

\* cited by examiner (a)

(b)

(a)

(b)

(a)

(b)

(c)

(d)

(e)

(f)

| Average results over the BSDS500 dataset | | | | |
|---|---|---|---|---|
| | | 30 regions | 150 regions | 600 regions |
| length | F4, AF4, 3OT | 23020,576 | 32110,896 | 49478,628 |
| | S-3OT | 16316,310 | 23562,800 | 37468,274 |
| | gain over 3OT | 29,12% | 26,62% | 24,27% |
| bps | F4 | 1,996 | 1,998 | 2,000 |
| | AF4 | 1,550 | 1,560 | 1,568 |
| | 3OT | 1,307 | 1,303 | 1,305 |
| | S-3OT | 1,259 | 1,280 | 1,330 |
| | gain over 3OT | 3,66% | 1,73% | -1,85% |
| bpp | F4 | 0,298 | 0,416 | 0,641 |
| | AF4 | 0,231 | 0,325 | 0,502 |
| | 3OT | 0,195 | 0,271 | 0,418 |
| | S-3OT | 0,134 | 0,196 | 0,323 |
| | gain over 3OT | 31,48% | 27,79% | 22,86% |

(a)

| Average symbol frequencies over the BSDS500 dataset | | | | |
|---|---|---|---|---|
| | 0 | 1 | 2 | 3 |
| F4 | 0,2553 | 0,2447 | 0,2553 | 0,2447 |
| AF4 | 0,4182 | 0,2778 | 0,3040 | - |
| 3OT | 0,4182 | 0,5051 | 0,0767 | - |
| S-3OT | 0,5806 | 0,3523 | 0,0555 | 0,0116 |

METHODS AND APPARATUSES FOR ENCODING AND DECODING SUPERPIXEL BORDERS

BACKGROUND OF THE INVENTION

Field of the Invention

The present invention is relative to the field of digital image and video coding.

Namely, the present invention describes a method and system for compressing and decompressing images, especially natural images, so that they can be delivered over bandwidth-constrained channels or stored on capacity-limited media.

The problem addressed by this invention is the encoding of images and video sequences composed by images as well.

Description of Prior Art

Most of the existing techniques rely, as the basic encoding tool, on a block-based transform known as the Discrete Cosine Transform (DCT), as for example in the various JPEG and MPEG coding standards.

The image is subdivided into blocks having a square shape and then the DCT is applied to each block (possibly adapting the size of the block to the image characteristics), which is then independently encoded and decoded in the simplest case (more advanced compression schemes may include intra-frame and inter-frame block prediction to improve the codec performance).

The DCT enjoyed widespread acceptance in image coding because it has the desirable property that it tends to cluster the perceptually most meaningful transform coefficients (i.e., to compact the energy of the signal) in the top-left part of the transform coefficients matrix, enabling efficient compression schemes such as non-uniform quantization, zig-zag coefficient scanning and entropy coding thereof.

Clearly, the actual ability of the DCT to compact the energy in the signal depends on the semantics of the particular image block which is encoded.

Homogeneous blocks (e.g., blocks representing the smooth surface of an object) are desirable, because they produce transform coefficient matrices with few significant coefficients, hence simple to encode, and do not produce reconstruction artifacts when recovered by the decoder.

Conversely, blocks which contain discontinuities (e.g., the juncture between objects of different color, text, etc.) result in matrices of transform coefficients where the significant coefficients are not constrained to an area of the matrix and which may yield significant reconstruction artifacts at the moment of their decoding.

The predefined square shape of the blocks represents one of the DCT biggest limits, as some discontinuity will be likely to be present in the blocks.

However most modern coding technologies address somehow this issue by adapting the size of each block to the characteristics of the image, in that context the image segmentation plays a key role.

Image segmentation is the partition of an image into areas or regions (also called "superpixels"), which correspond to different objects or parts of objects.

Locating areas of an image that are homogeneous by content is a well-known problem in the related literature which finds several practical applications. For example, one may want to separate a foreground object over a background image. Image segmentation algorithms enable to determine which pixels in an image belong to semantically affine regions, locating the boundaries which separate the regions.

Several different algorithms for image segmentation exist in the literature, and they differ not only by complexity, which affects the segmentation time, but also by the output, i.e., different image segmentation algorithms are expected to produce different segmentations of the same image.

Recently the SLIC (Radhakrishna Achanta, Appu Shaji, Kevin Smith, Aurelien Lucchi, Pascal Fua, and Sabine Süsstrunk, "*SLIC Superpixels*", EPFL Technical Report no. 149300, June 2010) algorithm was proposed in order to perform image segmentation in the context of image video coding.

In particular, the SLIC algorithm produces superpixels which stick to the image discontinuity. FIG. 1a shows a sample natural image with lots of details: the image is subdivided in semantically homogeneous regions which are similar (e.g.: the texture of the flowers, the marble round the window, etc.).

FIG. 1b shows the output of the SLIC algorithm over the image of FIG. 1a: the algorithm returns a large number of small superpixel which adhere to the borders of the object in the picture.

Document "*Superpixel-driven graph transform for image compression*" published in *Proc. IEEE International Conference on Image Processing (ICIP)*, 2015, E. Magli, M. Grangetto, F. Verdoja and G. Fracastoro, describe a digital images or video streams encoding and decoding system for subdividing an image in homogeneous coding areas of arbitrary shape, such that each area is simple to encode enabling a bandwidth-efficient graph-based representation.

With reference to FIG. 2, at the encoder 200, the image is first segmented in superpixels (unit 210) using the SLIC algorithm, then the located regions are iteratively clustered into larger superpixels until a certain predetermined requirement is met on the resulting superpixel set.

This predetermined requirement can be for example an image encoding target bitrate or optimum rate-distortion trade-off.

Successively, a graph Fourier transform (GFT) is carried out (unit 220) individually and independently on each superpixel of the set, in a piece-wise way.

A graph $G=(E,V)$ is composed of a set of nodes $v \in V$, connected with links. For each link $e_{i,j} \in E$, connecting nodes $v_i$ and $v_j$, there is an associated weight of non-negative value $w_{ij} \in [0,1]$, which captures the similarity between the connected nodes.

An image f can be represented as a graph where the pixels of the image correspond to the graph nodes, while the weights of the links describe the pixels similarity which can be evaluated using a predetermined non-linear function (e.g., Gaussian or Cauchy function) depending on the grayscale space distance $d_{i,j}=|f_i-f_j|$ between the i-th pixel $f_i$ and the j-th pixel $f_j$ of the image.

In the Graph Fourier transform (GFT) technique, the graph information can be represented with a weights matrix W which elements are the weights $w_{ij}$ of the graph, then the corresponding Laplacian matrix can be obtained as $L=D-W$ where D is a diagonal matrix with elements $$d_i = \sum_k w_{ik}.$$

The GFT is performed by the mathematical expression $\hat{f}=U^T f$ where U is the matrix which columns are the eigenvectors of the matrix L, and f is the raster-scanner vector representation of each superpixel samples.

The coefficients $\hat{f}$ are then quantized and entropy coded. The shape of the superpixels is conveyed in some encoded form to the decoding unit instead of the weights matrix W used in the GFT.

The superpixels are homogeneous internally, thus their corresponding weights matrix W can be approximated by a constant value, which allows to convey to the decoder the superpixel shape, in the form of a border $R^b$, rather than the full weights matrix W.

The superpixels borders are encoded as a black and white image (see FIG. 3b), according to any known lossless image compression/encoding technique (unit 230), for example by using an entropy encoder like JBIG (Joint Bi-level Image Experts Group).

At the decoder 250, the reconstructed image is obtained by performing the inverse entropy decoding of the superpixels borders $R^b$, and finally by performing the inverse graph Fourier transform of the superpixels coefficients $\hat{R}$.

To compress borders, chain code techniques are widely used as they preserve information and bring considerable data reduction.

The chain code techniques also allow various shape features to be evaluated directly from this representation; edge smoothing and shape comparison are also easily computed.

The ability of chain codes to describe regions by mean of their border shape is demonstrated to be the most efficient way to deal with this task.

H. Sánchez-Cruz, E. Bribiesca, and R. M. Rodriguez-Dagnino, in "*Efficiency of chain codes to represent binary objects*," published in *Pattern Recognition*, June 2007 and I. Schiopu and I. Tabus in "*Lossless contour compression using chain-code representations and context tree coding*," published in *Workshop on Information Theoretic Methods in Science and Engineering (WITMSE)*, Tokyo, 2013 shown that algorithms using chain codes achieve higher compression rate than JBIG.

Chain code algorithms encode binary regions by describing their contours using sequences of symbols from an alphabet.

The contour map of a binary input image I (FIG. 1b) is represented by the so called horizontal and vertical crack-edges, see example pictured in FIG. 4.

They are the contour line segments that separate two adjacent pixels: if the pixels belong to two different regions, the crack-edge is called "active"; otherwise, if they belong to the same region, the crack-edge is called "inactive".

The two ends of an active crack-edge are called vertices and are denoted as $P_k$ and $P_{k+1}$. Chain code algorithms encode active crack-edges by virtue of the position of their surrounding vertices.

FIG. 4 shows an example of a 3×3 sample image containing two regions: $R_1=\{x_{1,1}, x_{1,2}, x_{2,1}, x_{2,2}, x_{3,1}\}$ and $R_2=\{x_{1,3}, x_{2,3}, x_{3,2}, x_{3,3}\}$.

The contour map separating the two regions is represented using a vertex vector $\Gamma=[P_1P_2P_3P_4P_5]$, where the first vertex is selected using a known rule (e.g., the leftmost vertex, etc.).

The chain code algorithm translates the vector of consecutive vertices $\Gamma$ into a vector of chain code symbols $\Sigma=[S_1S_2S_3S_4S_5]$ by encoding a vertex $P_{k+2}$ according to its previous two vertices $P_k$ and $P_{k+1}$.

Typically, the symbol is used to represent the direction of the border with respect to previous steps, e.g., turn left, turn right, continue straight.

It has to be noted that for the first two vertices $P_1$ and $P_2$, some convention has to be used. The decoding process then takes $\Sigma$ and, applying an inverse translation, computes $\Gamma$.

The decoding process then reconstructs the binary image I by filling the regions enclosed by the crack-edges in $\Gamma$. Since all vertices are encoded according to their relative position to $P_1$, the absolute position of the latter has usually to be provided somehow as side information to the decoder.

After that, $\Sigma$ is further compressed with entropy coding techniques, e.g., Huffman, adaptive arithmetic coding, or context tree coding. The most diffused chain code approaches are briefly recalled in the following.

One of the first algorithms developed is the Freeman chain code proposed by H. Freeman, in "*On the Encoding of Arbitrary Geometric Configurations*," published in *IRE Transactions on Electronic Computers*, June 1961.

In a 4-connectivity context, the algorithm (F4) assigns a code from a 4-symbol alphabet $\{0,1,2,3\}$ to $P_{k+2}$ based on its relative position from $P_{k+1}$, according to the scheme presented in FIG. 5a.

Since one of the four directions is the one where $P_k$ is, and $P_{k+2} \neq P_k$, just three symbols should be enough to discriminate the remaining three directions.

Differential Freeman (AF4) (Y. Kui Liu and B. alik, "*An efficient chain code with Huffman coding*," Pattern Recognition, April 2005) uses the scheme illustrated in FIG. 5b, where the symbol "0" is used for "go forward", "1" for "turn left" and "2" for "turn right" according to the direction of the segment connecting $P_k$ and $P_{k+1}$.

The three-orthogonal symbol chain code (3OT) algorithm (H. Sánchez-Cruz and R. M. Rodríguez-Dagnino, "*Compressing bilevel images by means of a three-bit chain code*," Optical Engineering, vol. 44, no. 9, p. 97004, September 2005) uses a 3-symbol differential approach similar to AF4, but exploits one extra information: it keeps track of the last time that there has been a change in direction.

Then, "0" still means "go forward", but now "1" means "turn accordingly to the direction you were facing before the previous turn" while "2" means "turn the opposite way to the one you were facing before the previous turn".

As can be seen in FIG. 5c, when the previous direction is facing upward, turning upward again is coded as "1", while turning downward is coded as "2"; vice versa, when the previous direction is facing downward, the turning upward is coded as "2", while turning downward is coded as "1".

As discussed in H. Sánchez-Cruz, E. Bribiesca, R. M. Rodríguez-Dagnino and I. Schiopu, I. Tabus, 3OT is one of the better performing chain codes in the state of the art.

Chain codes have been designed to encode contours of objects. The context of segmentation region borders presents one characteristic that standard chain codes are not tailored to exploit: since all image pixels must be assigned to a region, all borders are shared between two regions.

In other words, the superpixels of an image have not isolated contour, conversely they share at least part of their borders with adjacent superpixels.

It follows that, if one chain code per border is used, all edges will be encoded almost twice, resulting in a higher number of symbols. Moreover, every chain code needs an edge coordinate, from where the code sequence is started.

SUMMARY OF THE INVENTION

The present invention aims at solving these and other problems by providing a method and an apparatus for encoding the superpixels border of an image or video stream employing a new chain coding strategy such that the symbols sequence is decoded by following the same order at the encoder, no need to select a starting reference vertex per each region, the codes are mapped to symbols that produce skewed symbol probability distribution so as to favour the following entropy coding stage.

The present invention discloses an improved chain code technique, which allows to encode efficiently the superpixels borders of a digital image or video stream, contributing to reduce their overall coding bitrate respect to compression techniques known in the prior art.

In particular, the present invention allows to reduce significantly the number of symbols to be transmitted or stored for coding such superpixel borders and to optimize the statistical distribution of the encoded symbols for their compression according to known encoding techniques, like, for example, an entropy coding technique.

In this way, the proposed invention can encode every region border only once, and can represent efficiently the contour of a segmented image or video stream.

Furthermore, the framework disclosed can be used in conjunction with any standard chain code.

BRIEF DESCRIPTION OF DRAWING

The characteristics and other advantages of the present invention will become apparent from the description of an embodiment illustrated in the appended drawings, provided purely by way of non-limiting example, in which:

FIG. 1a shows a sample natural image which is segmented into several regions, while FIG. 1b shows the superpixel map of the image as output of the SLIC image segmentation algorithm;

FIG. 13 shows the performance of the S-3OT chain encoder-decoder pair implemented according to the present invention;

DETAILED DESCRIPTION OF THE INVENTION

In this description, any reference to "an embodiment" will indicate that a particular configuration, structure or feature described in regard to the implementation of the invention is comprised in at least one embodiment. Therefore, the phrase "in an embodiment" and other similar phrases, which may be present in different parts of this description, will not necessarily be all related to the same embodiment. Furthermore, any particular configuration, structure or feature may be combined in one or more embodiments in any way deemed appropriate. The references below are therefore used only for simplicity's sake, and do not limit the protection scope or extension of the various embodiments.

Figure 3:
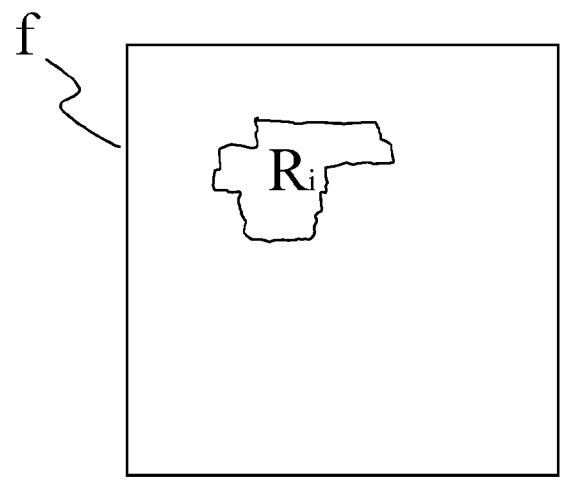
FIG. 3 shows a possible way to represent the shape of a certain superpixel $R_i$ in terms of superpixels belonging to it (a) or of its border pixels (b)
Figure 3:
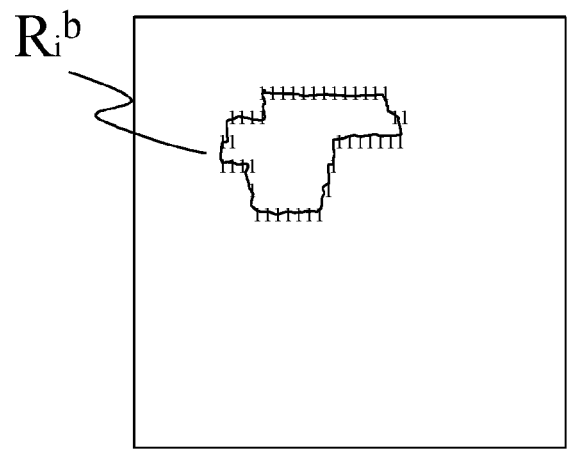
Figure 11:
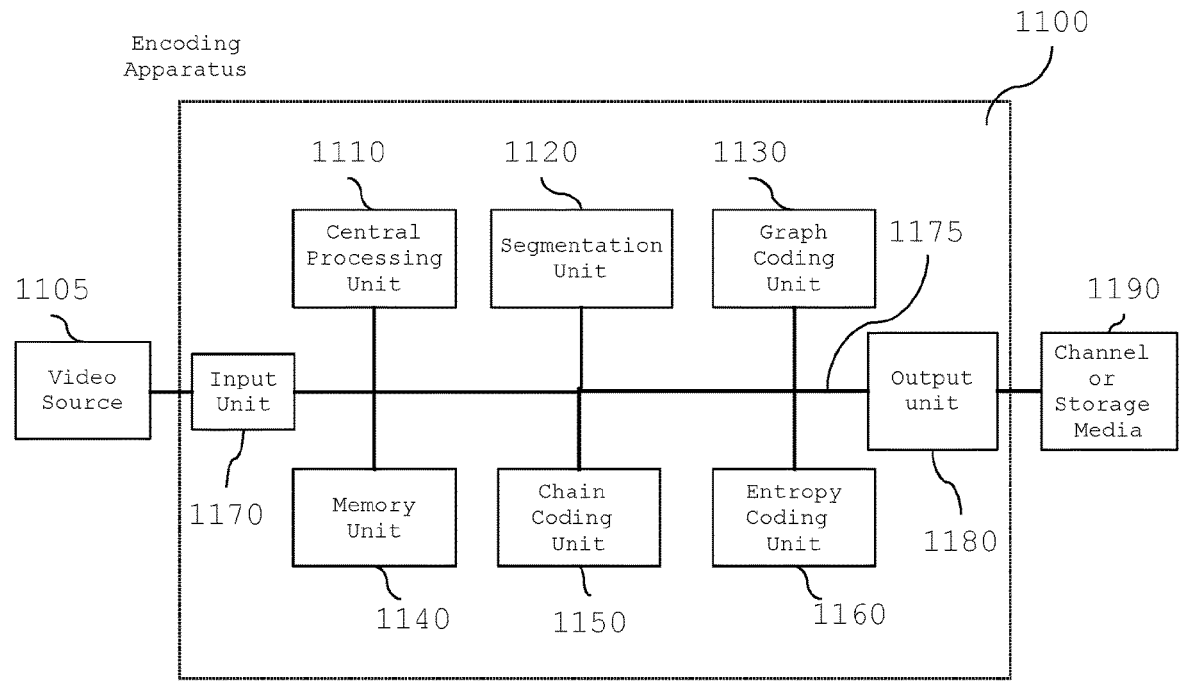
FIG. 11 shows a block diagram illustrating apparatuses for compressing digital image or video streams according to the present invention.

With reference to FIG. 11, an exemplary apparatus 1100 for compressing digital images or video streams (also named encoding apparatus 1100) according to an embodiment of the present invention preferably comprises the following parts:

a processing unit 1110, like a Central Processing Unit (CPU), configured for executing a set of instruction for carrying out a method for encoding digital images or video streams according to the invention (said method will be described in details in the following of present description);

a memory unit 1140 of any kind (volatile or non volatile, based on (semi)electronic and/or opto-electronic and/or magnetic means) containing data relating to the image to be compressed and preferably the instructions that implement the method for encoding digital images or video streams according to the invention, wherein the image data are a representation of at least a portion of said image and are preferably in binary format, and wherein said memory unit 1140 may also contain the result of the execution of instructions of said method;

an input unit 1170, which can be configured by the CPU 1110 to read from a (video) source 1000 images or video streams to be processed; such input unit may for example include an adapter according to at least one of the following standards: USB, Firewire, RS232, IEEE 1284, Ethernet, Wi-Fi, or the like;

optionally a segmentation unit 1120, which is configured for executing the phases of the method for segmenting the original image or video stream f; in particular, this unit is configured for receiving and partitioning the digital image f according to any segmentation algorithm known in the art, such as the SLIC algorithm, which subdivides the image f in n superpixels $\{R_1, \ldots, R_n\}$ wherein each i-th superpixel has pixels samples information $R_i$ and border information $R_i^b$ (see FIG. 3);

a graph coding unit 1130, which is configured for executing the phases of the method for encoding each superpixel according to a graph signal processing (GSP) techniques known in the art, such as the graph Fourier transform (GFT), wherein the pixel samples information $R_i$ and border information $R_i^b$ are employed for encoding each superpixel, and generating for each superpixel the graph based transformed coefficients $R^\wedge$ which are preferably quantized, for instance according to one or more predefined quantization parameters;

a chain coding unit 1150, which is configured for executing the phases of the method for receiving the border information $R^b$ of the entire set of superpixels $\{R_1, \ldots, R_n\}$, and coding the border information according to the present invention; in particular, the border information $R^b$ are encoded through a chain code technique such that the obtained symbols sequence $\Sigma$ is decoded by following the same order at the encoder, no need to select a starting reference vertex per each region, the codes are mapped to symbols that produce skewed symbol probability distribution;

preferably, a coding unit like preferably an entropy coding unit 1160, which is configured for receiving and entropy encoding the sequence of symbols $\Sigma$ according to any entropy coding technique known in the art, such as context-adaptive binary arithmetic coding (CABAC), and generating a compressed sequence of symbols $\Sigma^*$;

an output unit 1180 (e.g., a network or storage adapter), which can be configured by the CPU 1110 to transmit, through a communication channel, the processing result to a destination 1190 (e.g., a storage media, a remote client or the like); such output unit may for example include an adapter according to at least one of the following standards: Ethernet, SATA, SCSI, or the like;

a communication bus 1175, which allows the exchange of information between the CPU 1110, the segmentation unit 1120, the memory unit 1140, the graph coding unit 1130, the chain coding unit 1150, the entropy coding unit 1160, the input unit 1170, and the output unit 1180.

As an alternative to using the communication bus 1175, the CPU 1110, the segmentation unit 1120, the memory unit 1140, the graph coding unit 1130, the chain coding unit 1150, the entropy coding unit 1160, the input unit 1170, and the output unit 1180 can be connected by means of a star architecture or by any other means able to operatively couple such units one to the others.

The video source 1105 can be either a provider of live images, such as a camera, or a provider of stored contents such as a disk or other storage and memorization devices.

The Central Processing Unit (CPU) 1110 takes care of activating the proper sequence of operations performed by the units 1120, 1130, 1150, 1160 in the encoding process performed by the apparatus 1100. These units can be implemented by means of dedicated hardware components (e.g., CPLD, FPGA, or the like) or can be implemented through one or more sets of instructions which are executed by the CPU 1110; in the latter case, the units 1120, 1130, 1150, 1160 are just logical (virtual) units.

When the apparatus 1100 is in an operating condition, the CPU 1110 first fetches the image from the video source and loads it into the memory unit 1140.

Next, the CPU 1110 possibly activates the segmentation unit 1120, which fetches from the memory 1140 said image, executes the phases of the method for partitioning said image according to any segmentation technique known in the art, obtaining a set of n superpixels $\{R_1, \ldots, R_n\}$ wherein each i-th superpixel has pixel samples information $R^i$ and border information $R_i^b$, and stores them back into the memory unit 1140.

In another embodiment of the invention the image is submitted to the CPU by means of the input unit 1170 already in a segmented form, i.e., already subdivided into a plurality of superpixels. In such embodiment, the segmentation unit 1120 is absent from the encoding apparatus 1100 and the image segmentation is not performed by it.

Successively, the CPU 1110 activates the graph coding unit 1130, which fetches from the memory 1140 the pixels samples information $R_i$ and border information $R_i^b$ for each i-th superpixel, executes the phases of a method for encoding each superpixel according to a graph signal processing (GSP) techniques such as the Graph Fourier transform (GFT), and possibly quantizes the obtained pixels sample coefficients according, for instance, to one or more quantization parameters, and stores the resulting quantized coefficients $R^\wedge$ back into the memory unit 1140.

Then the CPU 1110 activates the chain coding unit 1150, which fetches from the memory 1140 the sets of superpixels border information, executes the phases of the method for chain encoding said border information according to the present invention (see FIG. 7 step 730), and stores the generated symbols sequence $\Sigma$ block in the memory unit 1140.

Successively, the CPU 1110 activates a coding unit like for example the entropy coding unit 1160, which fetches from the memory said symbols sequence $\Sigma$, executes the phases of the method for entropy encoding said symbols sequence $\Sigma$, obtaining a compressed sequence of symbols $\Sigma^*$ which is stored into the memory 1140.

At this point, the CPU 1110 may dispose of the data from the memory unit 1140 which are not required anymore at the encoder 1100.

Finally, the CPU 1110 fetches the preferably quantized coefficients $R^\wedge$ and the compressed symbols sequences $\Sigma^*$ from memory 1140 and puts it into the channel or saves it into the storage media 1195.

Figure 12:
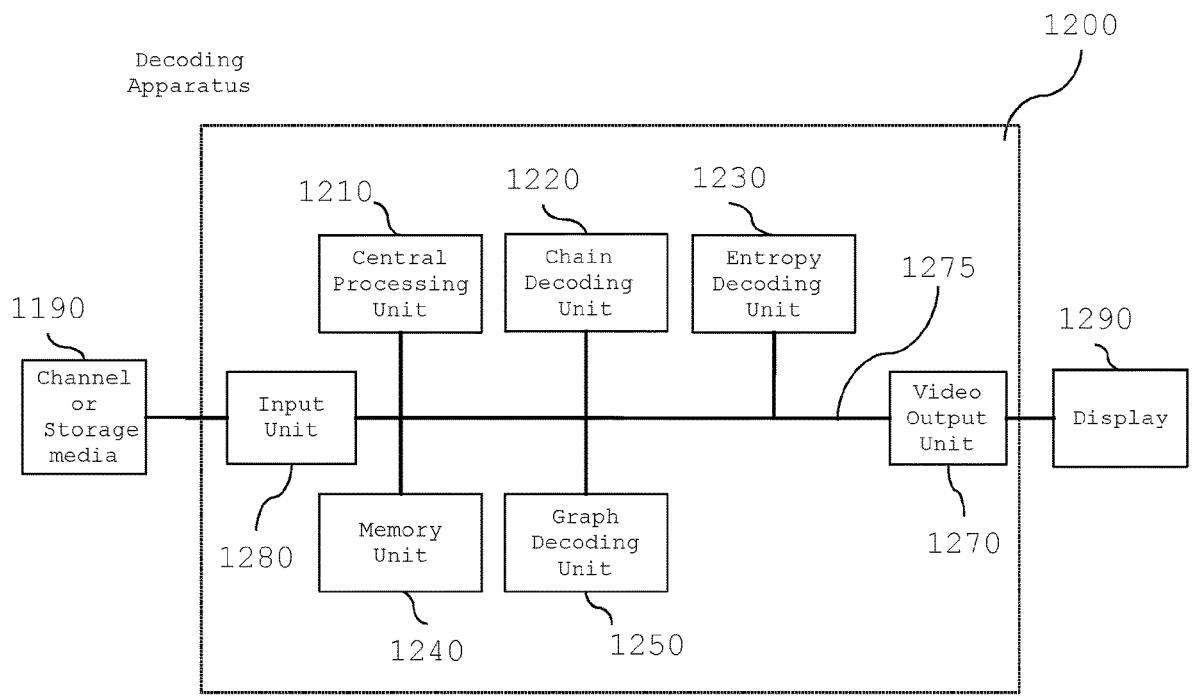
FIG. 12 shows a block diagram illustrating apparatuses for decompressing digital image or video streams according to the present invention.

With reference also to FIG. 12, an exemplary apparatus 1200 for decompressing digital images or video streams (also named decoding apparatus 1200) according to an embodiment of the invention preferably comprises the following parts:

a processing unit 1210, like a Central Processing Unit (CPU), configured for executing a set of instruction for carrying out a method for decoding digital images or video streams according to the invention (said method will be described in details in the following of present description);

a memory unit 1240 of any kind (volatile or non volatile, based on (semi)electronic and/or opto-electronic and/or magnetic means) containing data relating to the compressed image received and preferably the instructions that implement the method for decompressing digital images or video streams according to the invention, wherein the image data are a representation of at least a portion of said image and are preferably in binary format, and wherein said memory unit 1240 may also contain the result of the execution of instructions of said method;

an input unit 1280 (e.g., a network or storage adapter), which can be can be configured by the CPU 1210 to read the encoded images or video streams from a communication channel or storage media 1200; said input unit 1280 may for example comprise an adapter according to at least one of the following standards: Ethernet, SATA, SCSI, or the like;

preferably a decoding unit, like for instance an entropy decoding unit 1230, which is configured for executing the phases of entropy decoding the compressed sequence of symbols Σ*, obtaining the symbols sequence Σ, according to the encoding apparatus 1100;

a chain decoding unit 1220, which is configured for executing the phases of the method for decoding the symbols sequence Σ and for obtaining the border information for each superpixel;

a graph decoding unit 1250, which is configured for executing the phases of the method for decompressing digital images or video streams; in particular, this unit is configured for possibly de-quantizing the coefficients R^ of each superpixel if they have been quantized at the encoder side, and for performing an inverse graph Fourier transform of said de-quantized coefficients, wherein the said graph Fourier transform is determined as a function of the superpixels border information, such that the reconstructed image is recovered;

an output unit 1270, like a video adapter, which can be configured by the CPU 1210 to reproduce and/or output, preferably on a display 1295, the processed (decoded or decompressed) images or video streams; said output unit may for example include an adapter according to at least one of the following standards: VGA, S-video, HDMI, Ethernet or the like;

a communication bus 1275, which allows the exchange of information between the CPU 1210, the entropy decoding unit 1230, the chain decoding unit 1220, the graph decoding unit 1250, the memory unit 1240, the output video unit 1270, and the input unit 1280. As an alternative to using the communication bus 1275, the CPU 1210, the entropy decoding unit 1230, the chain decoding unit 1220, the graph decoding unit 1250, the memory unit 1240, the output video unit 1270, and the input unit 1280 can be connected by means of a star architecture or by any other means able to operatively couple such units one to the others.

As for the previously described encoding apparatus 1100, also the CPU 1210 of the decoding apparatus 1200 takes care of activating the proper sequence of operations performed by the units 1220, 1230 and 1250. These units can be implemented by means of dedicated hardware components (e.g., CPLD, FPGA, or the like) or can be implemented through one or more sets of instructions which are executed by the CPU 1210; in the latter case, the units 1220 and 1230 are just a logical (virtual) units.

When the apparatus 1200 is in an operating condition, the CPU 1210 first fetches the quantized coefficients R^ and the compressed symbols sequences Σ* from the channel or storage media 1190 and loads it into the memory unit 1240.

Then, the CPU 1210 activates the entropy decoding unit 1230, which receives from the memory 1240 the compressed symbols sequences Σ*, executes the phases of the method for obtaining a symbols sequence Σ, and stores it into the memory unit 1240.

Successively, the CPU 1210 activates chain decoding unit 1220, which fetches from the memory 1240 the symbols sequence Σ, executes the phases of the method for obtaining the superpixels border information, according to the invention, and stores them into the memory unit 1240.

Then, the CPU 1210 activates the graph decoding unit 1250, which fetches from the memory 1240 the superpixels border information, executes, if needed, the phases of the method for de-quantizing the coefficients R^ of each superpixel, and performing an inverse graph Fourier transform of said de-quantized coefficients, on the basis of the superpixels border information, recovering the reconstructed image, and stores into the memory unit 1240 the recovered image or video signal.

At this point, the CPU 1210 may dispose of the data from the memory which are not required anymore at the decoder side.

Finally, the CPU may fetch from memory 1240 the recovered image and send it, by means of the video adapter 1270, to the display unit 1290.

It should be noted how the encoding and decoding apparatuses described in the figures may be controlled by the CPU 1210 to internally operate in a pipelined fashion, enabling to reduce the overall time required to process each image, i.e., by performing more instructions at the same time (e.g., using more than one CPU and/or CPU core).

It should also be noted than many other operations may be performed on the output data of the coding device 1100 before sending them on the channel or memorizing them on a storage unit, like modulation, channel coding (i.e., error protection).

Conversely, the same inverse operations may be performed on the input data of the decoding device 1200 before effectively process them, e.g., demodulation and error correction. Those operations are irrelevant for embodying the present invention and will be therefore omitted.

Besides, the block diagrams shown in FIG. 11 and FIG. 12 are of exemplificative nature only; they allow to understand how the inventions works and how it can be realized by the person skilled in the art. The person skilled in the art understands that these charts have no limitative meaning in the sense that functions, interrelations and signals shown therein can be arranged in many equivalents ways; for example, operations appearing to be performed by different logical blocks can be performed by any combination of hardware and software resources, being also the same resources for realizing different or all blocks.

The encoding process and the decoding process will now be described in detail.

Encoding

In order to show how the encoding process occurs, it is assumed that the image to be processed is preferably a grayscale image $f=\{x_i\}_{i=0}^N$ with N pixels, where each pixel $x_i$ is encoded, for example, over 8 bit so that the value of said pixel can be represented for example by means of an integer value ranging between 0 and 255. Of course, the invention can be easily applied on any bit depth of the images, i.e., whatever is the number of bits used to represent each pixel in an image or whatever is the number of bits used to represent each color channel of the image in whatever color space.

In presence of color or multispectral image the encoding process needs to be iterated on every image channel, e.g., red, green and blue channels in the case of color images in RGB color space, or Y,U,V channels if luma/chrominances channels are used, or any other color or multispectral set of channels. Of course, more bits can be used for encoding a single pixel, like for example 12 or 16 bits or even higher for the so called images with higher depth colour.

With also reference to FIG. 11, it is now described how the different parts of the encoding apparatus 1100 interact for compressing digital images or video streams.

Figure 6:
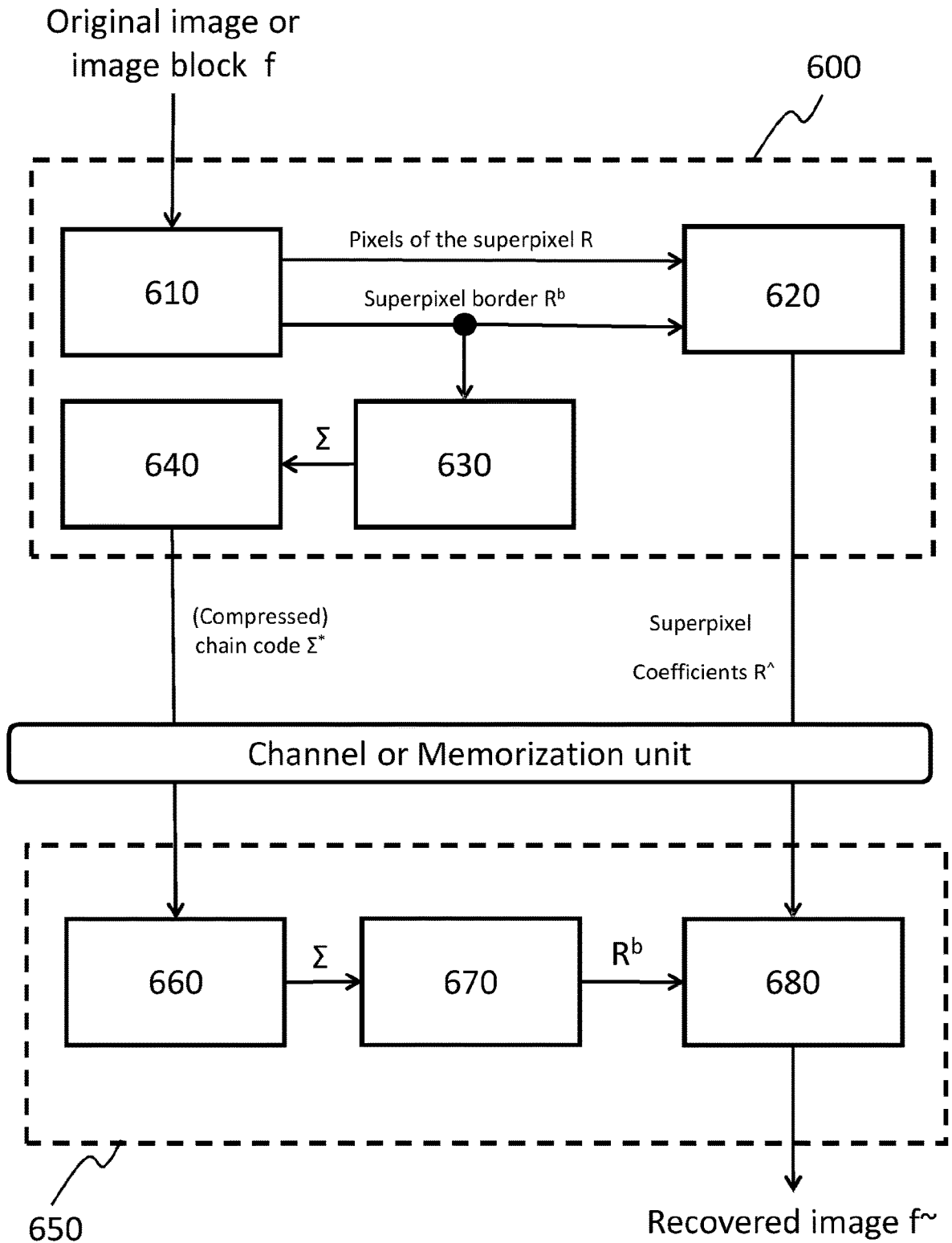
FIG. 6 illustrates a block diagram of image encoding-decoding system according to the present invention.
Figure 7:
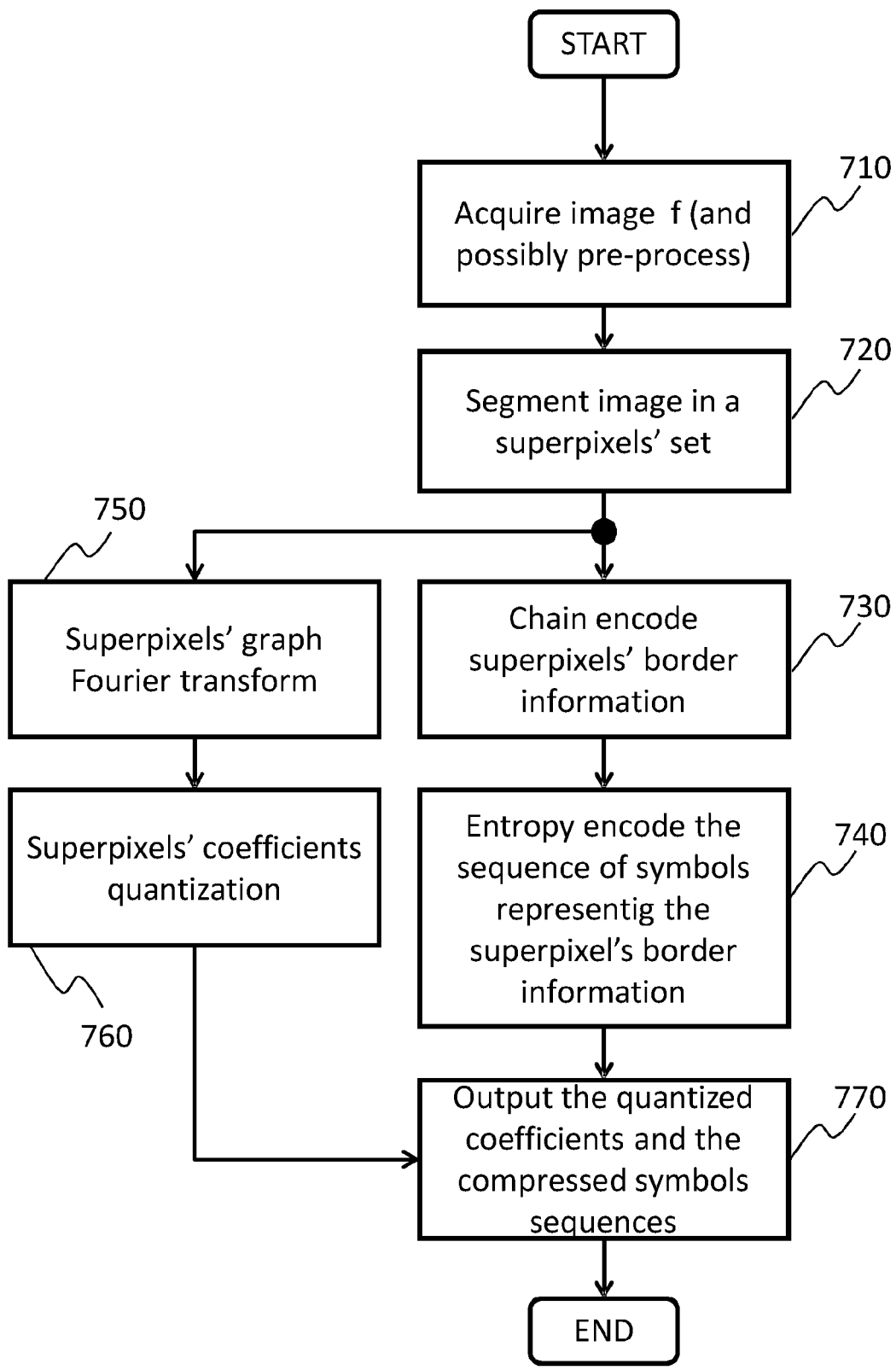
FIG. 7 shows a flow chart exemplifying an embodiment of the encoding technique in its entirety according to the invention.

With reference to FIG. 6 and FIG. 7, the decoder 600 comprises the image segmentation unit 610, the graph coding unit 620, the chain coding unit 630 and the entropy coding unit 640.

The image segmentation unit 610 preferably performs the following steps:

- an image acquiring step 710 for receiving the digital image f, and optionally for applying some pre-process techniques such as smoothing filter or sharpening filter, etc.;
- an optional segmentation step 720 for partitioning the pre-processed digital image f into a predefined number n of regions $R=\{R_i\}_{i=0}^n$ of the pixels of f; these regions are also called superpixels, and are determined by using some segmentation methods known in the art so that the following constraints are met $$\forall x \in f, \exists R_i \in R | x \in R_i; \ i=0, \ldots n$$

$$\forall R_i \in R, \exists R_j \in P-\{R_i\} | R_i \cap R_j \neq \emptyset; \ i,j=0, \ldots n \quad (1)$$

The shape $R_i^b$ of each i-th superpixel $R_i$ is represented in a black and white image, for example, of the same size of the original image to be encoded, wherein each pixel is encoded over 0 bit and can be represented on the screen of a display apparatus with black if it belongs to $R_i$, and white otherwise.

Of course, numerous techniques are possible for indicating which pixels of the image f belongs to a certain superpixel, i.e., to represent the shape or borders of a superpixel $R_i$ of the pool. For example, alternatively the border pixels of a superpixel can be set to "1", while all other pixels of the image assume the value "0" (see FIG. 3b and FIG. 1b). Anyway, the segmentation process is not part of the present invention, which simply teaches how to encode and decode the segmentation of an image, whatever way such segmentation has been carried out.

The graph coding unit 620 preferably performs the following steps:

- a superpixel encoding step 750 for encoding each superpixel $R^i$ using the superpixel border information $R_i^b$, by applying a graph signal processing (GSP) techniques, such as the Graph Fourier transform (GFT), due its ability to be applied on arbitrarily-shaped image areas. The resulting encoded superpixel data set is outputted in form of a set of GFT transformed superpixel coefficients;
- preferably a quantization step 760 for quantizing the set of GFT transformed superpixel coefficients, according to one or more predefined quantization parameters (the same possibly used at the decoding apparatus 1200), obtaining a set of GFT transformed and quantized superpixel coefficients $R_i^{\hat{}}$.

The chain coding unit 630 preferably performs a step 730 for encoding the superpixel border information according to the present invention.

In particular, the disclosed method can be used in conjunction with any standard, known chain code technique; in this embodiment, the 3OT chain code is considered, due to the aforementioned qualities.

The disclosed method will be referred as Segmentation-3OT (S-3OT).

According to the idea of the disclosed invention, the S-3OT exhibits the following properties:

a) the decoding process should require no information other than the symbols sequence and the sizes of the image. No offsets or starting positions are used for each chain code;

b) the symbols sequence is decoded by following the same order at the encoder, in this way the information of the previously encoded border is available and is exploited during the encoding/decoding stage;

c) the chain code symbols must be selected so that their probability distribution is likely to be highly skewed to favour the following entropy coding of such symbols at a very low bitrate.

For each superpixel $R_i \in R$, $\Gamma_i = [P_k^i]_{k=1}^m$ is the vector containing all m vertices of the active crack-edges of $R_i$, sorted clockwise, starting from a vertex determined accordingly to some convention. Clearly, the selection of either a clockwise or a counter-clockwise directions corresponds to select a coding order for each superpixel border of the segmented image.

It should be noted that all crack-edges touching the image border are considered active and are included in $\Gamma_i$.

Figure 1:
Figure 1:
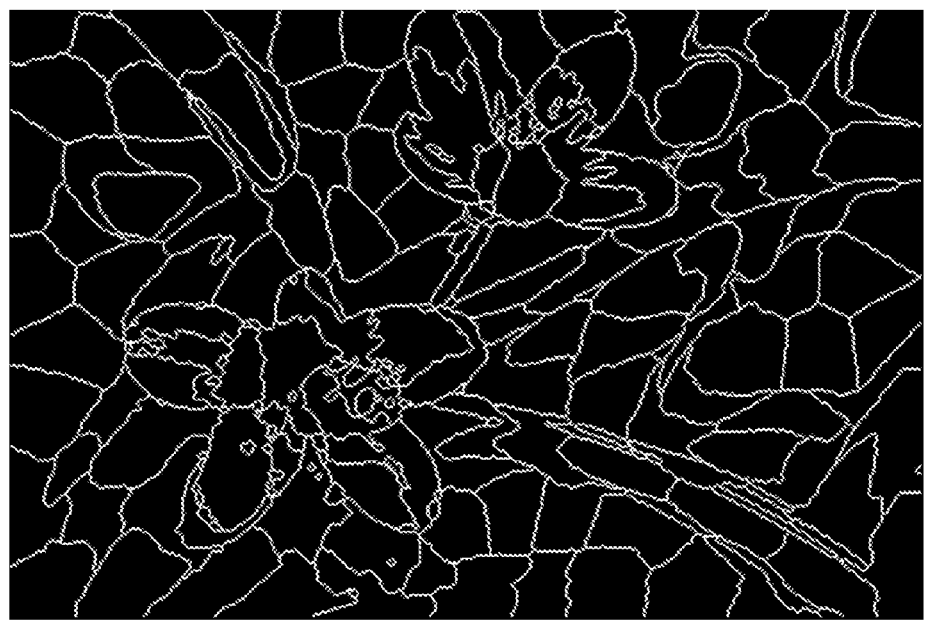
Figure 2:
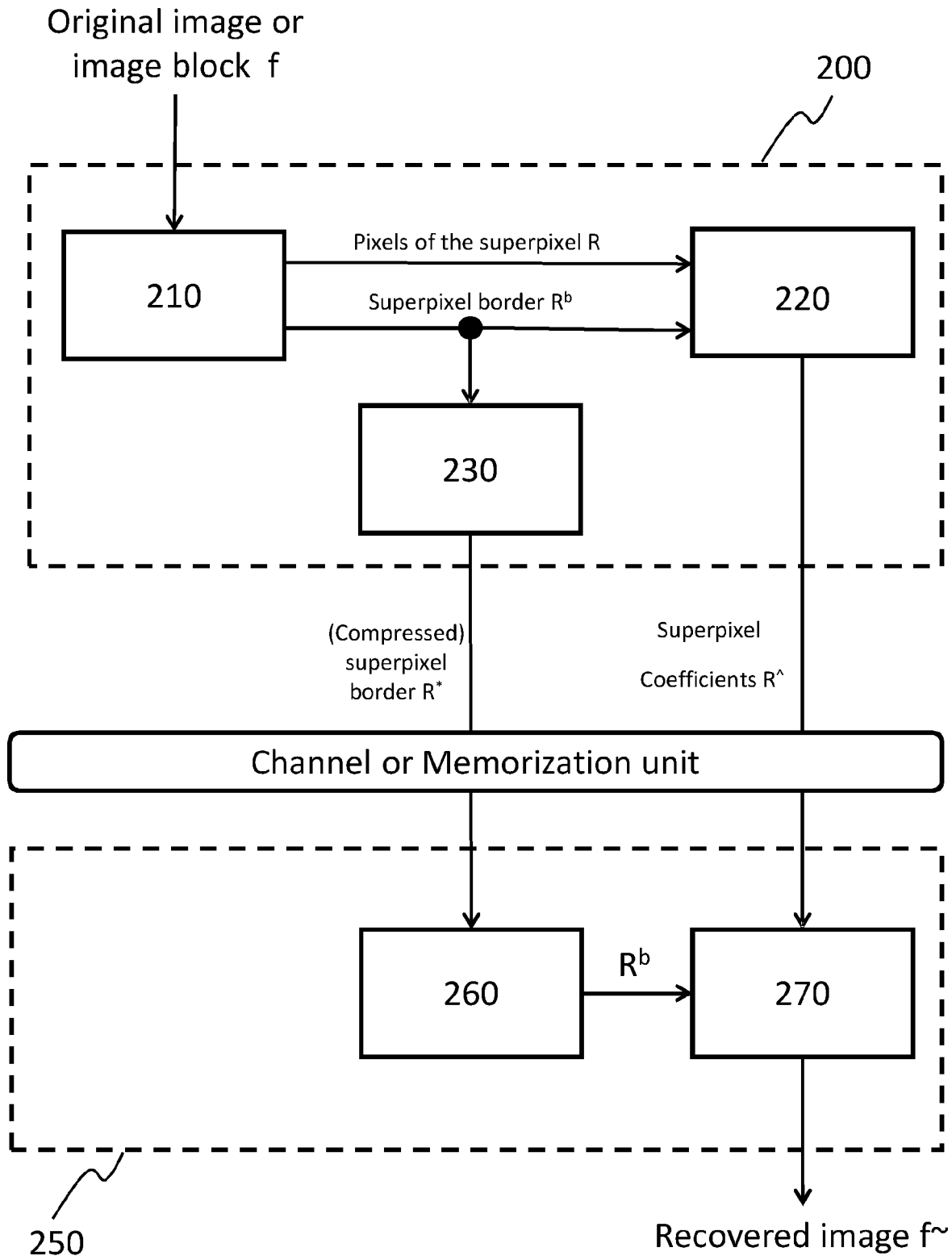
FIG. 2 shows a block diagram of an encoding-decoding architecture known in the art, where the superpixel of the image are encoded by using graph signal processing (GSP) techniques.

Moreover, it has to be noted that since the region is closed, $P_m^i = P_1^i$. FIG. 1b shows an example of superpixel border information which are encoded employing the method of the present invention.

Considering the standard 3OT chain code technique, one approach might be to encode the whole border grid at once; chain codes follow a single path along a border and therefore it would be necessary to keep track of all the crossings that in turn could require a significant coding overhead.

Another approach might be to encode the borders region by region, however each crack-edge will be encoded twice, as each border is always shared between two regions.

A possible countermeasure to the previous issue is to use some conventions to decide which of the two regions "owns" a specific crack-edge, e.g., all crack-edges are owned by the leftmost or topmost region.

Then, when a region is encoded, the edges not owned by that region will be skipped; also this approach requires some coding overhead to signal the offset to jump to the next owned coordinate of the edge.

Finally, in order to encode regions by chain codes known in the art, is needed to specify a starting position in some way.

Method S-3OT takes into account the above mentioned a, b, c properties, and uses a hybrid approach in respect to both the approaches above discussed: S-3OT method proceeds region by region, but keeps track of the path it has already covered once, avoiding to encode it twice.

S-3OT maintains a vector $\underline{\Gamma}$ of vertices which have been already encoded i.e., it represents the overall set of the known border.

$\underline{\Gamma}$ is initialized with all vertices lying on the image canvas starting from the top left most vertex of the image and going clockwise around the image border.

$\underline{\Gamma}$ is going to be used as "context" during the encoding to adhere to the property b.

Method S-3OT also maintains a set $\underline{R}$ which contains the regions still to be encoded; initially $\underline{R}=R$.

Then, until $\underline{R}=\emptyset$, the chain coding unit 630 selects the region $R_i \in \underline{R}$ containing the pixel x in the topmost position first and then leftmost position among the regions still in $\underline{R}$; it then encodes the i-th vertices vector $\Gamma_i = [P_k^i]_{k=1}^m$ using the vertex in the top-left corner of x as the initial or first vertex $P_1^i$, and then enumerating the vertices clockwise.

Using this convention, neither regions starting point coordinates and regions coding order have to be transmitted to the decoder (Property a).

Also, $P_1^i$ and $P_2^i$ do not need to be encoded, as their position is always known by the way $P_1^i$ is selected, indeed they will always lay on the top crack-edge of $\underline{x}$.

In other words, the left and top crack-edge of $\underline{x}$ have already been coded, otherwise $\underline{x}$ would not be the selected starting pixel of a given region.

Given the i-th superpixel border information $R_i^b$ to be encoded, the corresponding vertices vector $\Gamma_i$ can be considered, then the symbols sequence $\Sigma_i$ can be generated; in particular, considering two consecutive vertices $P_k$ and $P_{k+1}$ of $\Gamma_i$, the symbol $S_{k+2}{}^i \in \{0,1,2,3\}$ of $\Sigma_i$, which is assigned to the vertex $P_{k+2}$, can be determined according to the following chain code rules.

Rule 1 (Follow the known border) is applied when $P_{k+2}$ lays on a known border, more precisely if $$[P_k{}^i P_{k+1}{}^i] \in \underline{\Gamma} \wedge P_{k+2}{}^i \in \underline{\Gamma} \quad (2)$$

then $S_{k+2}{}^i = 0$. It should be noted that in this context "0" is used even if the border is changing direction.

Rule 2 (Leave the known border) is considered when $P_{k+2}$ leaves a known border, more precisely if $$[P_k{}^i P_{k+1}{}^i] \in \underline{\Gamma} \wedge P_{k+2}{}^i \notin \underline{\Gamma} \quad (3)$$

then two of the four directions must be discharged, in fact one is where $P_k{}^i$ is, and the other is where the known border would continue.

Consequently, just two directions for $P_{k+2}$ have to be selected, furthermore the symbol "0" cannot be used, as it would be interpreted according to Rule 1 by the decoder.

Thus, symbols "1" and "2" can be used to discriminate between the two possible directions.

Figure 9:
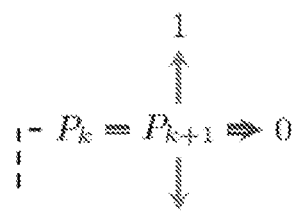
FIG. 9 shows a graphical representation of S-3OT chain code, according to the Rule 2: the crack-edges marked with double lines are lying on the know border.
Figure 9:
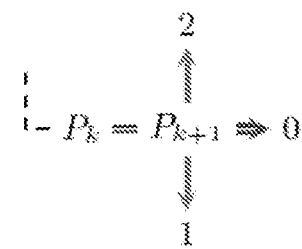
Figure 9:
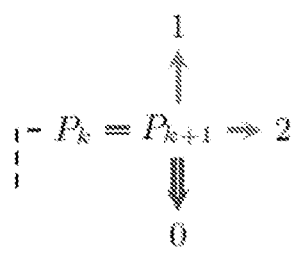
Figure 9:
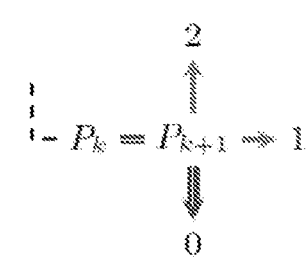
Figure 9:
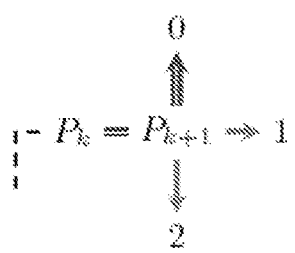
Figure 9:
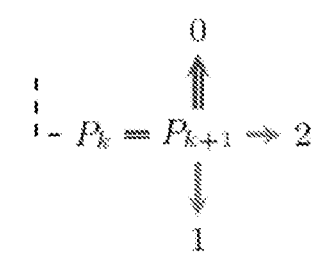

A graphical representation of these rules is given in FIG. 9. It can be noticed that when the known border $\underline{\Gamma}$, which is indicated with double lines and double arrows, is proceeding straight (FIG. 9a and FIG. 9b), the symbols assigned to the other directions are the same 3OT would have used.

In all other cases, the known border is not straight. In this cases, if $P_{k+2}{}^i$ is straight ahead of $P_k{}^i$ and $P_{k+1}{}^i$, the symbol that 3OT would have assigned to the direction occupied by the known border is used; instead, the other direction maintains the corresponding 3OT symbol.

To give one example, in the case presented in FIG. 9c, if the direction to follow is upward then the symbol "1" is used, which is the one 3OT would have used.

"Going downward" following the known border $\underline{\Gamma}$ is encoded as "0", according to Rule 1.

"Going straight" is encoded as "2", as it is the symbol 3OT would have assigned to the direction where the known border is, i.e., downward.

In other words, according to these rules, considering "0" the symbol used to follow the known border (Rule 1), if the direction of the known border is not straight, the symbol that 3OT should use to follow the known border direction is swapped with "0", see FIGS. 9c, 9d, 9e, 9f.

This strategy allows to increase the occurrence of "0" (property c) i.e., the symbol chosen for representing the direction of the known border, decreasing the occurrence of the symbols used for encoding the other directions.

Therefore, in this case there is a sort of memory information, i.e., the previous direction is used to code the next symbol.

It should be noted that this strategy can be adopted for any chain code technique known in the art such as F4 and AF4, not only for 3OT.

It should be also noted that the directions of the border can be coded by considering any other symbols set $\{A, B, C, D\}$, or any permutation of $\{0,1,2,3\}$.

Figure 5:
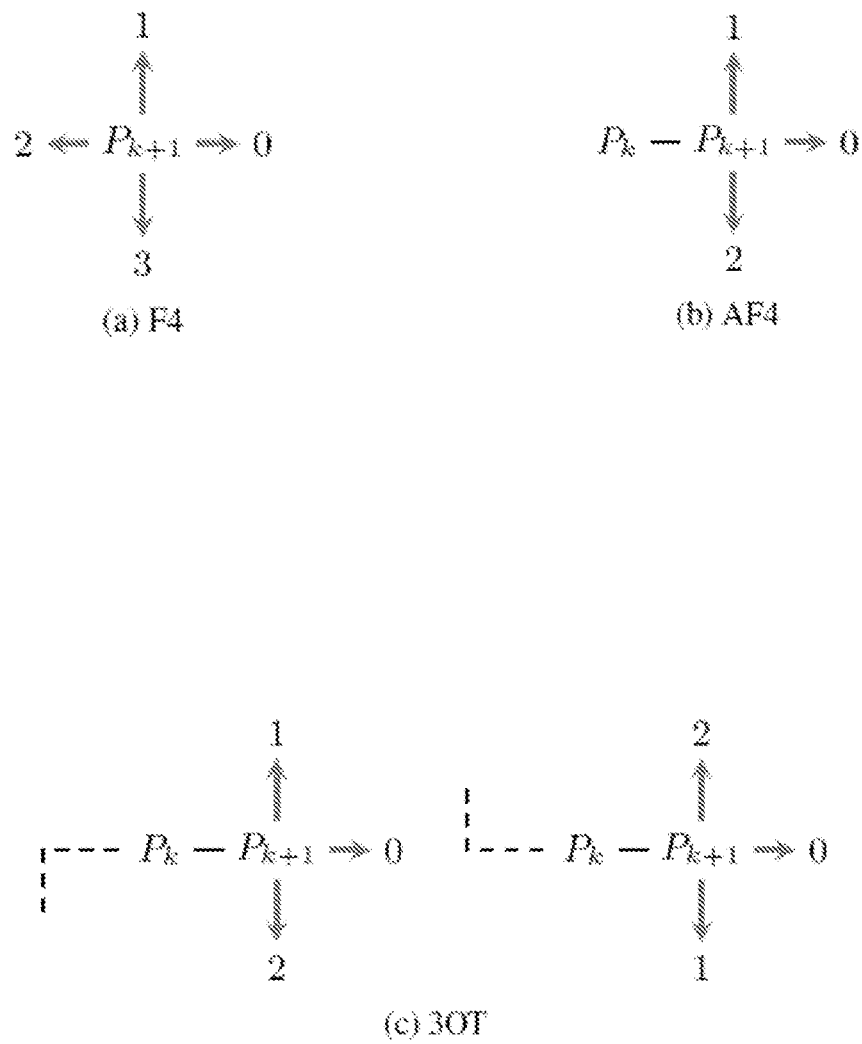
FIG. 5 shows a graphical representation of F4, AF4 and 3OT chain codes known in the art.

Rule 3 (Not on the known border) is considered when $P_k$, $P_{k+1}$ and $P_{k+2}$ are not on the known border $\underline{\Gamma}$, more precisely if $$[P_k{}^i P_{k+1}{}^i P_{k+2}{}^i] \notin \underline{\Gamma} \quad (4)$$

then S-3OT uses the classical 3OT code, i.e., $S_{k+2}{}^i = S_{k+2}{}^{3OT}$, see FIG. 5c.

Rule 4 (Follow until the end) is applied if more than two symbols need to be encoded for a region, then the symbol "3" is appended to the chain code, and the encoding of $R_i$ ends.

This symbol indicates to the decoder that from $P_{k+2}{}^i$ onward it just has to follow the known borders until the starting point is reached again.

It should be noted that Rule 4 can be selected when less than three symbols need to be coded for that region, otherwise Rule 4 will never be selected. Equivalently, referring to the vertices instead of the symbols, one can say that Rule 4 can be selected when the number of vertices pertaining to the border still to be encoded is greater than two.

This has been chosen because if just one or two segments or vertices are left to be encoded, appending one or two "0" respectively is more convenient than appending a "3", since "0" will be the most frequent symbol (property c).

After the computation of $\Sigma_i$ is terminated, either by going through all $\Gamma_i$ or by the special symbol "3", $\underline{\Gamma}$ is recomputed including also all vertices in $\Gamma_i$, $R_i$ is removed from $\underline{R}$, and $\Sigma_i$ is appended to the end of $\Sigma$. Method S-3OT then proceeds selecting the next region to be encoded until $\underline{R} = \emptyset$.

Figure 10:
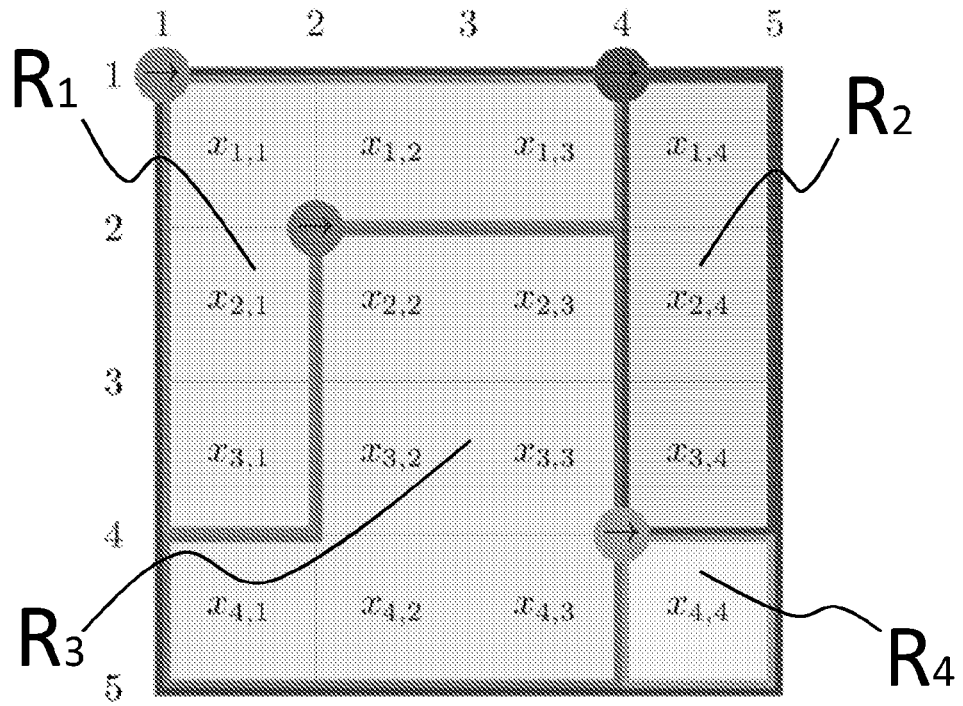
FIG. 10a shows a 4×4 pixels image which is segmented in four regions, and illustrates the S-3OT chain encoding process according to the present invention.
FIG. 10b compares the symbols sequences generated by the known F4, AF4 and 3OT chain codes with the new S-3OT chain code.

FIG. 10a presents a simple example of application of method S-3OT; in particular, a 4×4 pixels image $\{x_{1,1}, x_{1,2}, \ldots x_{4,4}\}$ is partitioned in four regions or superpixels $R_1$, $R_2$, $R_3$, $R_4$.

As described above, the known border $\underline{\Gamma}$ is initialized with the contour of the 4×4 pixels image.

$R_1$ is the first region to be considered because it contains the topmost first and then the leftmost pixel $x_{1,1}$ among the regions still to be encoded $\underline{R} = (R_1, R_2, R_3, R_4)$, then $\Gamma_1$ is encoded considering the vertex in the top-left corner of $x_{1,1}$ and enumerating the vertices of $\Gamma_1$ clockwise.

The horizontal active crack-edge (1,1)-(1,2) does not need to be encoded; indeed, its position is always known because of the considered conventions, successively the horizontal active crack-edges (1,2)-(1,3) and (1,3)-(1,4) are both coded as "0" because they lay on the known border $\underline{\Gamma}$ according to Rule 1.

Next, the vertical crack-edge leaves the know border $\underline{\Gamma}$, thus it is coded as "2" according to Rule 2, see FIG. 9a.

Successively, all the active crack-edges (2,4)-(2,3), (2,3)-(2,2), (2,2)-(3,2), (3,2)-(4,2), (4,2)-(4,1) and (4,1)-(3,1) are not in the know border $\underline{\Gamma}$, thus they are coded with standard 3OT schema as "201012", according to Rule 3.

Finally, the crack-edges (3,1)-(2,1) and (2,1)-(1,1) are both on the know border $\underline{\Gamma}$ and they follow $\Gamma_1$ until the initial or first vertex (1,1) is reached, this is the case where just one or two segments are left to be encoded, and thus appending one or two "0" is more convenient than appending a "3", allowing the symbol "0" to be the most frequent symbol (property c).

At this point, the know border $\underline{\Gamma}$ is updated by performing the union of $\Gamma_1$ and the previous $\underline{\Gamma}$, whereas the still to be encoded regions set $\underline{R}$ is updated by removing $R_1$, so that $\underline{R} = (R_2, R_3, R_4)$.

According to an embodiment of the present invention, $R_2$ is the second region to be considered for the coding process, the sequence of symbols "0022200" is obtained following the Rules 1, 2, 3, 4 as described above, while $R_3$ is the third region to be considered for the coding process which gives the sequence of symbols "000123".

In particular, this region $R_3$ gives an example of Rule 2 as pictured in FIG. 9e (see vertex 4,4), and Rule 4, in the case when more than two segments are left to be encoded, so that the symbol "3" is appended in the sequence.

Finally, the border related to the latest region is encoded using the symbol "3", according to Rule 4. It should be noted that the latest region is always encoded as "3" and thus this latest symbol can be omitted from the sequence. It has to be noted that the sequence produced by S-3OT is considerably shorter than the ones computed by standard chain codes, see FIG. 10b.

The technique disclosed in the present invention produces chain codes which are strictly shorter than those produced by classical chain codes, which use exactly one symbol for each vertex.

Method S-3OT does not encode $P_1$ and $P_2$, resulting in one less symbol for each region, then it is also able to terminate the code with the symbol "3", gaining possibly many more symbols.

The symbol frequencies for S-3OT are partly dependent on 3OT ones and partly on the Rules discussed above. The symbol "3" has the lowest frequency as it is used at most once for each region, symbols "1" and "2" have frequencies highly dependent on the shape of the regions, but as for 3OT, is expected that "1" is more frequent than "2".

Finally, is expected that "0" is the most frequent symbol, given its double meaning in the code. These frequencies are in line with property c and should allow the code to be highly compressible.

It has to be noted that $P_1^i$ will always be in $\underline{\Gamma}$, if $R_i$ is not a completely contained regions, i.e., a region which lays entirely inside another region without being adjacent to any other third region.

This allows S-3OT to operate without the need of starting coordinates (property a). In the case of a completely contained region, one solution might be to split the containing region into two regions to be merged again while decoding.

Also, thanks to the way $P_1^i$ is selected it is always know that the last turn was upward and that the first movement will go right, this allow to avoid encoding $P_1^i$ and $P_2^i$.

The entropy coding unit 640 preferably comprises the following (physical or logical) parts:
  an entropy encoder unit configured for performing an entropy encoding step 740 wherein the sequence of symbols $\Sigma$ generated by the previews unit 630 is entropy encoded, according to any entropy coding technique known in the art, and generating a compressed sequence of symbols $\Sigma^*$;
  an output unit for performing an outputting step 770 wherein the quantized coefficients of each superpixel are outputted, as well as the compressed sequence of symbols $\Sigma^*$ representing the compressed border information of the superpixels.

Summarizing, with also reference to FIG. 6 and FIG. 11, the method for encoding digital images according to the invention comprises the following phases:
  a receiving phase, wherein at least a portion of a digital image f is received by means of the input unit 1170;
  an optional segmentation phase, wherein said received digital image f is partitioned according to any segmentation technique known in the art, which subdivides said image f in a set of n superpixels wherein each superpixel has pixels samples information and border information;
  a graph coding phase, wherein for each superpixel, said pixels samples information are encoded according to a graph signal processing (GSP) techniques known in the art, such as the graph Fourier transform (GFT); wherein said GFT is determined by employing said superpixel border information, and obtaining for each superpixel the graph based transformed coefficients;
  an optional quantization phase, wherein for each superpixel, said graph based transformed coefficients are quantized according to one or more predefined quantization parameters (the same possibly used at the decoding stage), obtaining for each superpixel the quantized and transformed coefficients;
  a chain coding phase, wherein all the superpixels border information are encoded applying the chain code technique according to the present invention, obtaining a sequence of symbols representing the superpixels border information, such that the symbols sequence is decoded by following the same order at the encoder, no need to select a starting reference vertex per each region, the codes are mapped to symbols that yield skewed symbol probability distribution;
  an optional entropy coding phase, wherein said sequence of symbols is entropy encoded employing any entropy coding technique known in the art, obtaining a compressed sequence of symbols representing the overall superpixels border information.

Finally, said compressed sequence of symbols and said quantized and transformed coefficients can be transmitted and/or stored by means of the output unit 1180.

Decoding

With also reference to FIG. 12, it is now described how the different parts of the decoding apparatus 1200 interact for decompressing digital images or video streams.

Figure 8:
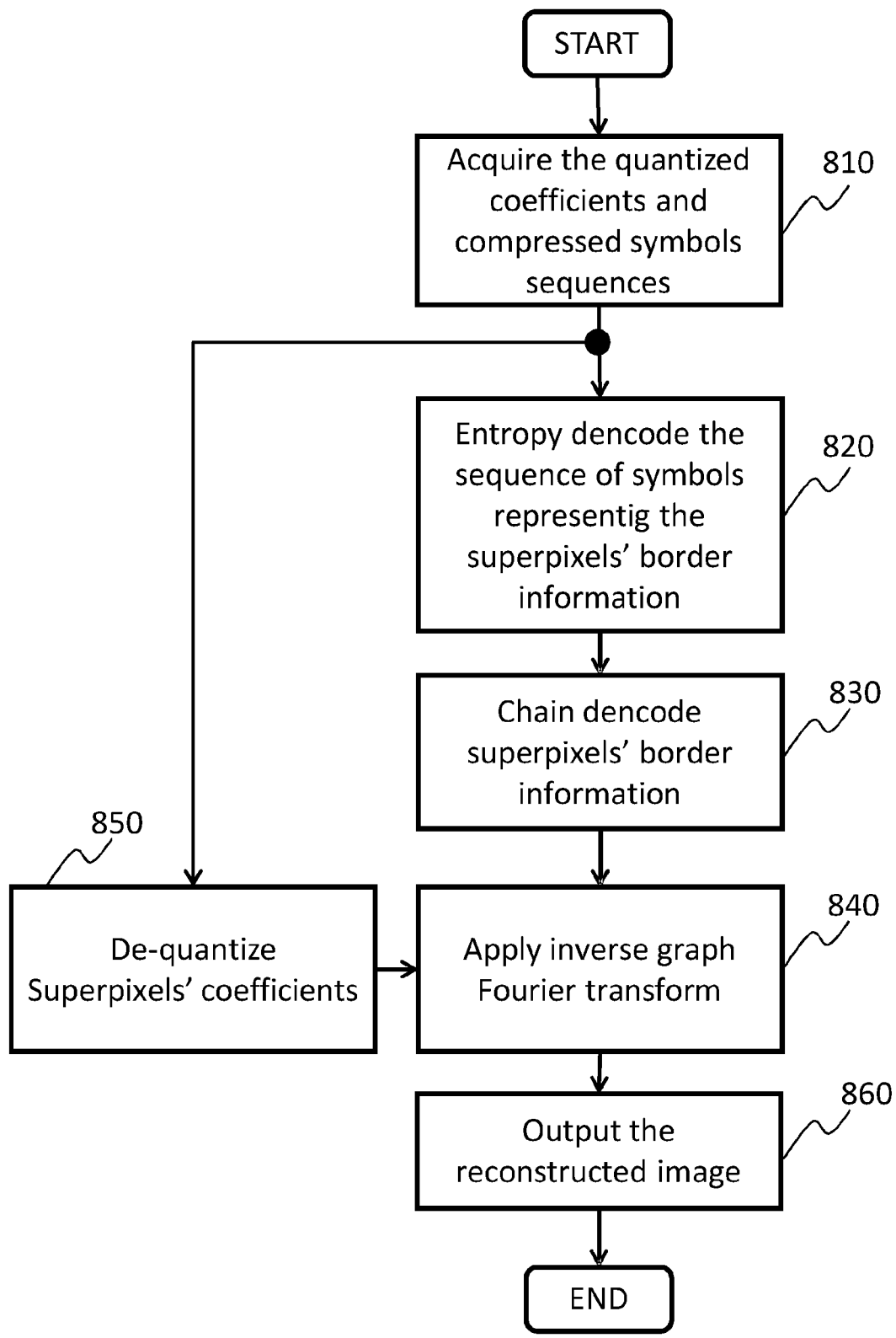
FIG. 8 shows a flow chart exemplifying an embodiment of the decoding technique in its entirety according to the invention.

With reference to FIG. 6 and FIG. 8, the decoder 650 comprises the entropy decoding unit 660, the chain decoding unit 670 and the graph decoding unit 680.

The entropy decoding unit 660 preferably comprises the following (physical or logical) parts:
  a receiving unit configured for acquiring at step 810 the quantized coefficients of each superpixel, and the compressed sequence of symbols $\Sigma^*$ representing the overall compressed border information of the superpixels.
  an entropy decoding unit configured for entropy decoding at step 820 the compressed sequence of symbols $\Sigma^*$, according to any entropy coding technique known in the art (the same used at the encoder apparatus 1100), and generating the sequence of symbols $\Sigma^*$ representing the borders information of the superpixels in which the coded image is partitioned.

The chain decoding unit 670 preferably comprises a physical or logical part configured for decoding at step 830 the sequence of symbols $\Sigma$ according to the present invention.

Figure 14:
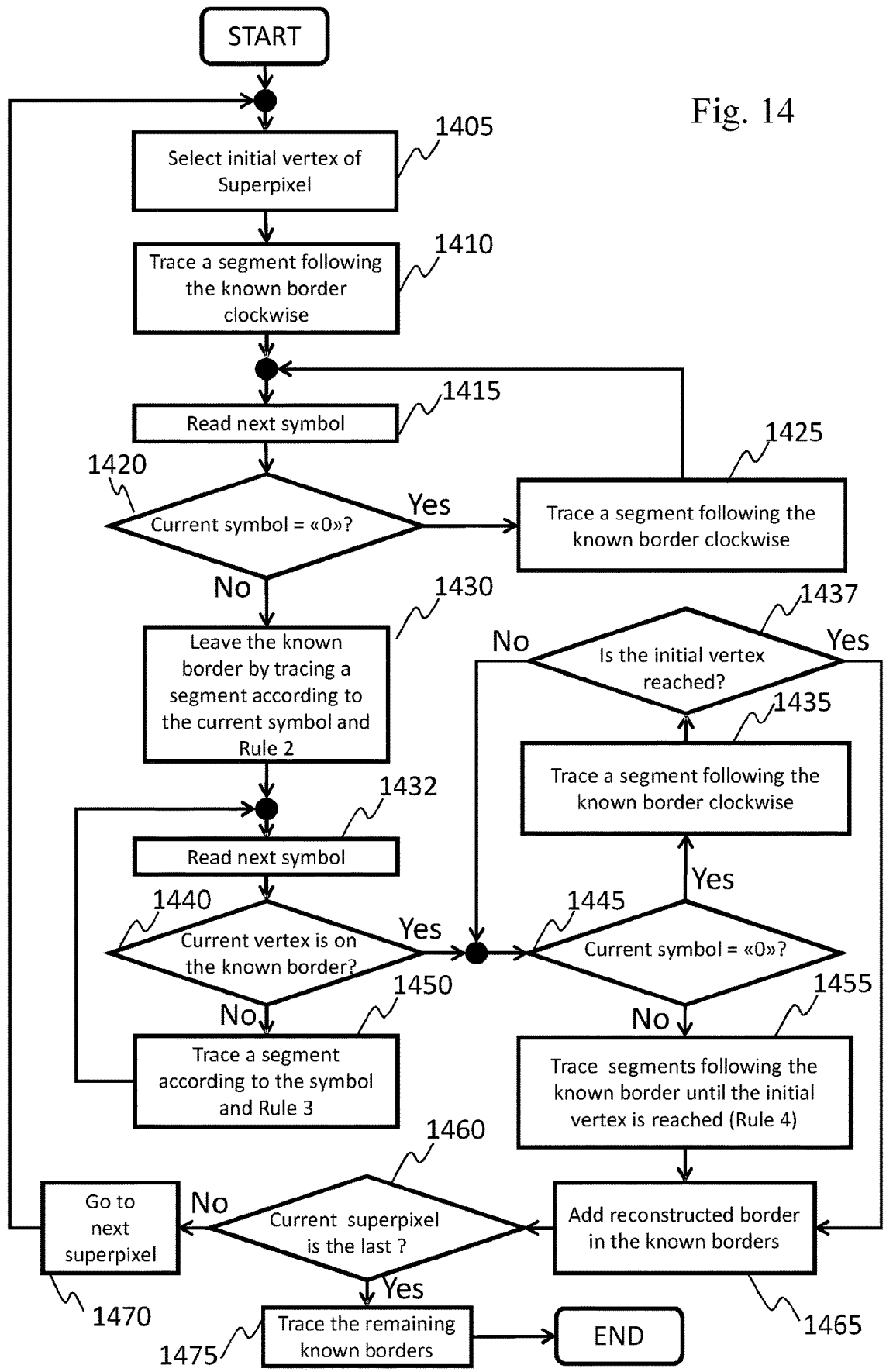
FIG. 14 shows a flow chart diagram illustrating an embodiment of a method for reconstructing the border of superpixels according to the present invention.
Figure 15:
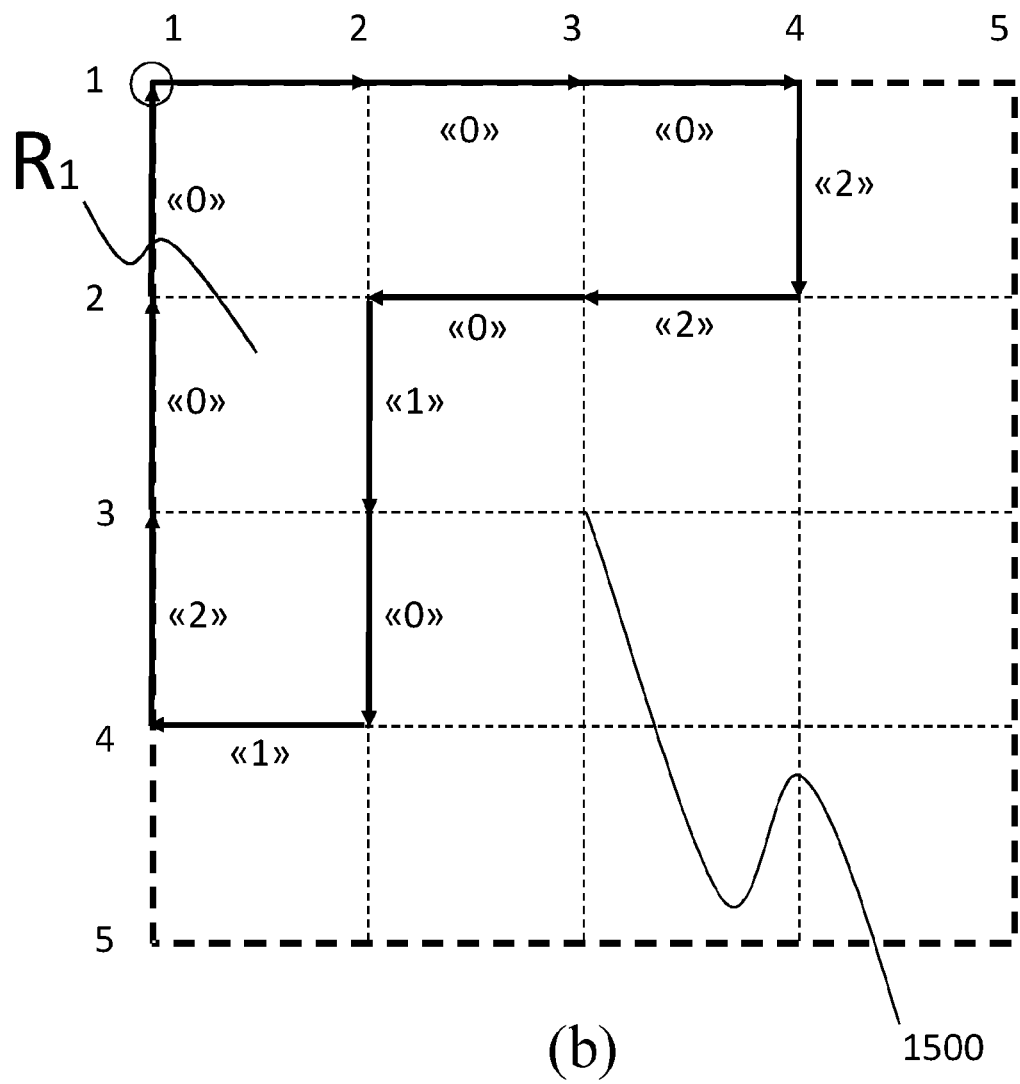
FIG. 15a shows an exemplary S-3OT symbols sequences to be decoded in reference to FIG. 15b.
FIG. 15b illustrates a 5×5 grid of vertices in which the S-3OT chain decoding process is performed, according to an embodiment of the present invention.

With reference to FIG. 14 and FIG. 15, the sequence of symbols to be decoded, as the S-3OT sequence represented in FIG. 15a, here reported, is: "00220101200 0002200 000123 3" wherein the blank between figures is just for separating the different superpixel borders since actually nothing is transmitted or received to that purpose.

The decoding unit 670 first takes into account a 5×5 grid of vertices 1500 (FIG. 15b) on the basis of the given image size (4×4 pixels).

According to the conventions discussed in the coding stage (step 730), the known border ($\underline{\Gamma}$) is initially set as comprising the vertices of the external border of the image (bold dashed lines), whereas the starting vertex of the first superpixel border to be reconstructed is the top-left most vertex (1,1) of the 5×5 grid of vertices 1500 (step 1405) and going clockwise around the image border.

Given the clockwise decoding direction, the decoding unit 670 first traces the segment (1,1)-(1,2) of the known border (step 1410); then, according to Rule 1, the decoding unit 670 traces the segment (1,2)-(1,3) and (1,3)-(1,4) whose both lie on the known border (steps 1415, 1420, 1425), by following the two "0" symbols at the beginning of the symbols sequence.

It should be noted that the segment (1,1)-(1,2) does not require any symbol according to the aforementioned conventions.

Next, following symbol "2", according to Rule 2, the known border is left by tracing the segment (1,4)-(2,4), as indicated at step 1430.

Subsequently, according to Rule 3, the segments which are not on the known border (2,4)-(2,3), (2,3)-(2,2), (2,2)-(3,2), (3,2)-(4,2), (4,2)-(4,1) and (4,1)-(3,1) are traced by following the symbols sequence "201012" according to the 3OT technique (steps 1432, 1440, 1450).

At this point vertex (3,1), which lies on the known border, is reached.

Thus, according to Rule 4, because vertex (3,1) is separated by the first vertex (1,1) by two vertices on the known border, the next two "0" symbols indicate to the decoding unit 670 to trace the known border until the first vertex (1,1) is reached (steps 1445, 1435, 1437).

In step 1445, if the current symbol is not equal to "0", according to Rule 4 it must be the symbol "3", which indicates to the decoding unit 670 to follow the known border until the first vertex (1,1) is reached.

In this way, the border of the first superpixel is completely reconstructed and thus the decoding unit 670 adds it into the known border ($\Gamma$). At this point the decoding unit 670 proceeds to reconstruct the border of the second superpixel, the starting vertex of the latter is (1,4), i.e., the vertex positioned in the first topmost and then the leftmost of the region which border still to be reconstructed.

It should be noted that the above tracing of the superpixel borders is described just for illustrating purposes, since to trace a segment from a vertex A to a vertex B is equivalent to add to the vertex A previously added to the border the vertex B, where each vertex can be individuated by its coordinates on the grid 1500.

So, for example to trace the segment (1,2)-(1,3) starting from vertex (1,2) is equivalent to say that the decoding unit added at a previous reconstruction step vertex (1,2) to the border of $R_1$ and at the subsequent step adds vertex (1,3) on the basis of the received symbol "0".

Figure 4:
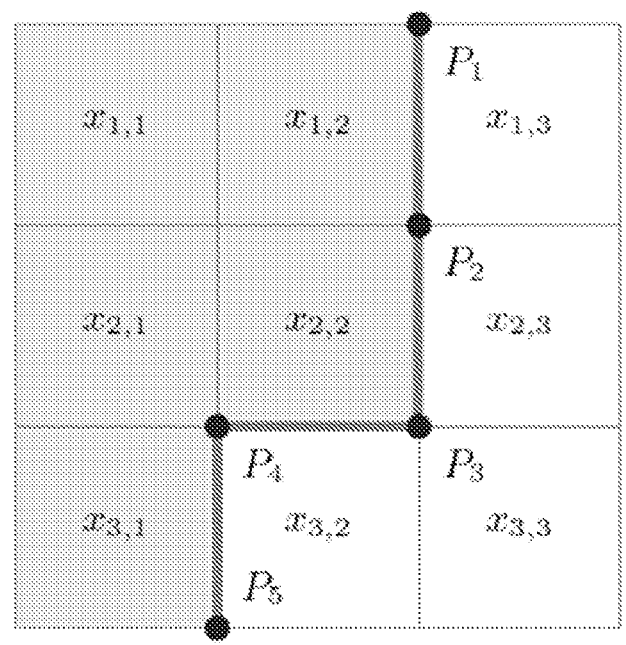
FIG. 4 shows a 3×3 image segmented into two regions where the active crack-edges are outlined by dark lines.

In this way, given a S-3OT sequence of symbols and considering the aforementioned conventions, which allow to select the decoding direction and the initial vertex on the grid of vertices, and by following Rules 1, 2, 3 and 4, all the superpixels border information can be retrieved on the grid of vertices 1500, and can be represented in a black and white image as pictured in FIG. 1*b* and FIG. 3*b*. This can be done, for example by setting the pixel adjacent in the left (or adjacent in the right) of the border as "0" and by setting "1" otherwise (see also FIG. 4).

The graph decoding unit 680 preferably comprises the following (physical or logical) parts:

an optional de-quantization unit which is configured for de-quantizing, at step 850, the set of quantized coefficients of each superpixel $R_i^{\wedge}$, according to one or more predefined quantization parameters (the same possibly used at the encoder apparatus 1100), obtaining a set of graph Fourier transformed superpixels coefficients;

a superpixel decoding unit configured for decoding, at step 840, each superpixel coefficients, by applying an inverse Graph Fourier transform, which is determined by using the superpixel border information $R_i^b$ previously decoded at unit 670;

an output unit which is configured for outputting, at step 860, the reconstructed image.

Summarizing, with also reference to FIG. 6 and FIG. 12, the method for decoding digital images or video streams according to the invention preferably comprises the following phases:

a receiving phase, wherein the quantized coefficients of each superpixel, and the compressed sequence of symbols $\Sigma^*$ are received by means of the input unit 1280;

a preferred entropy decoding phase, wherein the compressed sequence of symbols $\Sigma^*$ are entropy decoded, according to any known entropy coding technique used during the encoding process, obtaining the sequence of symbols $\Sigma$ representing the superpixels border information;

a chain decoding phase, wherein the sequence of symbols $\Sigma$ is decoded by following the same order at the encoder, no need to select a starting reference vertex per each region, the codes are mapped to symbols that yield skewed symbol probability distribution, obtaining the superpixels border information;

an optional de-quantization phase, wherein the set of quantized coefficients of each superpixel are de-quantized, according to one or more predefined quantization parameters, obtaining a set of superpixels coefficients;

a graph decoding phase, wherein each superpixel coefficients are decoded by applying an inverse Graph Fourier transform, which is determined by using the superpixels border information.

Finally, the reconstructed image can be outputted by means of output video unit 1270 and displayed on the display unit 1290.

Therefore, the present invention relates to a method for encoding the borders of pixel regions of an image, wherein the borders contain a sequence of vertices subdividing the image into regions of pixels (superpixels), by generating a sequence of symbols from an alphabet comprising the step of:

defining for each superpixel a first vertex for coding the borders of the superpixel according to a criterion common to all superpixels;

defining for each superpixel the same coding order of the border vertices, either clockwise or counter-clockwise;

defining the order for coding the superpixels on the base of a common rule depending on the relative positions of the first vertices;

defining a set of vertices as a known border ($\Gamma$), wherein the following steps are performed for selecting a symbol of the alphabet, for encoding the borders of the superpixels:

a) determining the first vertex of the next superpixel border individuated by the common criterion;

b) determining the next vertex to be encoded on the basis of the coding direction;

c) selecting a first symbol ("0") for encoding the next vertex if the next vertex of a border pertains to the known border ($\Gamma$), d) selecting a symbol ("1"; "2") different from the first symbol ("0") if the next vertex is not in the known border ($\Gamma$);

e) repeating steps b), c), d) and e) until all vertices of the superpixel border have been encoded;

f) adding each vertex of the superpixel border that was not in the known border ($\Gamma$) to the set ($\Gamma$);

g) determining the next superpixel whose border is to be encoded according to the common rule, if any;

i) repeating steps a)-g) until the borders of all the superpixels of the image have being added to the known border ($\Gamma$).

In particular, initially the set of known borders comprises only the external contour of the image, whose vertices are ordered according to the common criterion and the common rule.

In one or more embodiments, the common criterion is the relative position of the first vertex within the overall border of the superpixel.

In one or more embodiments, the steps c) and d) are not performed for each second vertex of the superpixel border.

In various embodiments, a further different symbol "3" is selected for encoding all the next remaining vertices of the current border if the previously encoded vertex is comprised in the set $\Gamma$ and the number of vertices pertaining to the border still to be encoded is greater than two.

In one or more embodiments, at step d) the symbol "1" or "2" different from the first one "0" is selected based on the fact that the previously encoded vertex pertains or not to the set $\Gamma$.

In one or more embodiments, step d) comprises:
d1) selecting the symbol "1" or "2" different from the first one "0" according to a known border encoding technique if the previously encoded vertex is not in the set $\Gamma$, and
d2) selecting such different symbol "1" or "2" according to rules different from those of the known border encoding technique otherwise.

Furthermore, the present invention relates also to a method for reconstructing the borders of pixel regions (superpixels) of an image on the base of the decoding of a received sequence of symbols. In particular, the borders contain a sequence of vertices subdividing the image into superpixels. The reconstructing method comprises:
   defining a first vertex for coding the superpixel according to a criterion common to all superpixels;
   defining for each superpixel the same decoding order for reconstructing the border vertices, either clockwise or counter-clockwise;
   defining the order for decoding the superpixels on the base of a common rule depending on the relative positions of the first vertices;
   defining a set of vertices as a known border ($\Gamma$),
wherein the following steps are performed for reconstructing the borders of the superpixels:
   a) determining as first vertex of the current border to be reconstructed the vertex individuated by the common criterion;
   b) reading the next symbol of the received sequence;
   c) adding to the current border the next vertex pertaining to the set ($\Gamma$) if the symbol is equal to a first symbol ("0");
   d) adding to the current border a vertex not pertaining to the set ($\Gamma$) if the symbol is not equal to a first symbol ("0");
   e) repeating steps b), c), d) and e) until the entire border of the superpixel has been reconstructed;
   f) adding each vertex of the superpixel border that was not in the set ($\Gamma$) to the known border ($\Gamma$);
   h) determining the next superpixel whose border is to be reconstructed according to the common rule, if any;
   i) repeating steps a)-h) until the all the symbols of the sequence have been read.

Moreover, the initially set $\Gamma$ comprises only the external contour of the image, whose vertices are ordered according to the common criterion and the common rule.

In particular, the common criterion is the relative position of the first vertex within the overall border of the superpixel.

In various embodiments, for adding the second vertex of a superpixel border, step b) and d) are not performed and step c) is replaced by adding to the current border the next vertex pertaining to the set ($\Gamma$).

In various embodiments, the vertex added at step d) depends on the fact that the vertex added previously pertains or not to the set $\Gamma$.

In one or more embodiments, step d) comprises:
   d1) adding a vertex by reversing the rules of a known border encoding technique if the vertex previously added does not pertain to the set $\Gamma$);
   d2) adding a vertex in according to rules different from those of the known border encoding technique otherwise.

In one or more embodiments, if the read symbol is equal to a further different symbol ("3"), a further step g) is performed before step h) comprising:
   adding from the set ($\Gamma$) all the remaining vertices of the current superpixel until reaching the first vertex.

Moreover, the present invention relates also to an image processing apparatus comprising a processing unit as well as a memory unit, an input interface and an output interface operatively coupled to said processing unit. In the image processing apparatus, the input interface is configured to receive an image segmented into a plurality of pixel regions (superpixel); the processing unit is configured to read said segmented image by means of said input interface and to produce on said output interface a sequence of symbols representing an encoding of the borders of said superpixel by executing a set of instructions stored in said memory unit performing the method for encoding On the other side, an image processing apparatus comprises a processing unit as well as a memory unit, an input interface and an output interface operatively coupled to said processing unit. In the image processing apparatus, the input interface is configured to receive a symbol sequence representing, in encoded form, a set of borders of pixel regions (superpixels) individuating a segmentation of an image; the processing unit is configured to read said symbol sequence by means of said input interface and to produce on said output interface the image segmentation reconstructing the borders of the superpixels by executing a set of instructions stored in said memory unit performing the method for reconstructing the borders of pixel regions.

With reference to FIG. 13, the results of performance tests conducted by the Applicant are going to be discussed.

In this test, a S-3OT chain encoder-decoder pair implemented according to the present invention has been evaluated.

The tests were performed over the 500 images in the BSDS500 dataset (P. Arbela'ez, M. Maire, C. C. Fowlkes, and J. Malik, "*Contour Detection and Hierarchical Image Segmentation,*" *IEEE Transactions on Pattern Analysis and Machine Intelligence*, vol. 33, no. 5, pp. 898-916, 2010).

All images in the dataset have a resolution of 481×321 pixels.

The tests were performed by varying the number of segmentation regions: the SLIC technique was used to produce first 30, then 150 and finally 600 regions for all the 500 images in the dataset.

In all scenarios completely contained regions have been removed.

Then, the chain codes of the segmentation contours using F4, AF4, 3OT and S-3OT were produced.

For performance evaluation, the first order entropy of each chain code sequence was computed, in order to get an estimate of the coding rate measured in bit per symbol (bps).

In FIG. 13a, the average performance over the 500 images in the dataset over the three scenarios are reported in terms of length of the chain code sequence, bit per symbol estimate and image compression rate expressed in bit per pixel (bpp).

In FIG. 13b the average frequencies of each symbol for each chain code are reported as well; this table confirms that S-3OT complies well with property c.

It has to be noted that, although the added symbol to the 3OT alphabet weighs a little bit on the bps scores of S-3OT, the smaller number of symbols and the higher asymmetry in the symbol frequencies compensate for that, letting the overall number of bits (and corresponding compression rate) to be the best with respect to all other techniques with a gain of 31%, 28% and 23%, for the cases with 30, 150 and 600 regions, respectively.

This gain is clearly explained with the S-3OT capacity to efficiently encode already known borders, either using symbol "0" or "3".

It has to be also noted that S-3OT gains are larger when the number of regions to be coded is lower. In fact, bigger regions will have longer shared borders; then, every time a symbol "3" is inserted, it allows to avoid the encoding of larger portions of the border. Also, the symbol "0" is going to be used more often.

In conclusion, the obtained results show that the method described in the present invention can outperform the state-of-the-art superpixels border coding schemes.

In an embodiment of the invention the same approach devised to avoid to encode every border in common between any two regions twice can be extended to other chain code rules as those recalled above: e.g., F4, AF4.

In a further embodiment of the invention a larger set of angles to represent contour directions can be used.

The disclose approach takes into account the 4-connected pixel borders, but it can be extended to 6- and 8-connectivity, i.e., when describing 3D polygonal faces.

In this scenario, the chain code will include more directions but the coding principle remains the same.

In another embodiment of the invention an arbitrarily shaped contour, that encloses all the segmented regions, can be used to initialize the know border, instead the rectangular image canvas.

In an embodiment of the invention the GFT and IGFT have been used for encoding and decoding the superpixels. However, any other kind of graph transform suitable to the purposes of this invention can be used.

In an embodiment of the present invention, the image to be coded may be preliminarily filtered so to remove high frequency components and reduce the resulting coding bitrate. Examples of appropriate filters include Gaussian or linear or bi-linear or cubic filtering.

In another embodiment, the image may be segmented in superpixels using a different segmentation scheme than the SLIC algorithm considered in the present description. Suitable image segmentation techniques include the normalized cuts algorithm (Jianbo Shi, Jitendra Malik, "Normalized Cuts and Image Segmentation", IEEE Transactions on Pattern Analysis and Machine Intelligence, Volume 22 Issue 8, August 2000) the algorithm by Felzenswalb and Locker (Pedro Felzenszwalb, Daniel P. Huttenlocher, "Efficient graph-based image segmentation", International Journal of Computer Vision 59.2, 2004) among the others.

In another embodiment, the transform coefficients are further compressed with existing coding techniques prior they are put on the channel or memorized in a storage unit and is decompressed at the receiver prior to be processed by the graph decoding unit. Suitable coding techniques include non-uniform quantization, zig-zag scanning, differential coding and entropy coding.

The invention can be adapted so as to be used for compressing also color images. In case of an RGB image, for example, the invention can be used to compress at least one of the R G or B components; since the components are in general strongly correlated, at least as far as the edges are concerned, it is possible to infer or predict the edges of the other components on the base of those of the starting one.

Analogously, in case of a YUV coded color image, the luminance component Y can be compressed according to the invention, while the chroma components U and V can be compressed and decompressed in a similar way as their difference signal from Y (Y-U and Y-V), with some adaptations taking into account the different statistical features of the chroma components with respect to luminance.

The invention can be also integrated in a video coding technique wherein also the temporal correlation between different images of the video sequence must be taken into account. To that end, a prediction mechanism similar to those used in the conventional video compression standards can be used in combination with the invention for effectively compressing and decompressing a video signal.

The present description has tackled some of the possible variants, but it will be apparent to the man skilled in the art that other embodiments may also be implemented, wherein some elements may be replaced with other technically equivalent elements. The present invention is not therefore limited to the explanatory examples described herein, but may be subject to many modifications, improvements or replacements of equivalent parts and elements without departing from the basic inventive idea, as set out in the following claims.

The invention claimed is:

1. A method for encoding the borders of pixel regions of an image, wherein the borders contain a sequence of vertices subdividing the image into regions of pixels (superpixels), by generating a sequence of symbols from an alphabet comprising:
   defining for each superpixel a first vertex for coding the borders of said superpixel according to a criterion common to all superpixels;
   defining for each superpixel the same coding order of the border vertices, either clockwise or counter-clockwise;
   defining the order for coding the superpixels on the base of a common rule depending on the relative positions of said first vertices;
   defining a set of vertices as a known border ($\Gamma$),
   wherein the following steps are performed for selecting a symbol of the alphabet, for encoding the borders of the superpixels:
   a) determining the first vertex of the next superpixel border individuated by said common criterion;
   b) determining the next vertex to be encoded on the basis of said coding direction;
   c) selecting a first symbol ("0") for encoding said next vertex if the next vertex of a border pertains to said known border ($\Gamma$),
   d) selecting a symbol ("1"; "2") different from said first symbol ("0") if the next vertex is not in said known border ($\Gamma$);
   e) repeating steps b), c), d) and e) until all vertices of the superpixel border have been encoded;

f) adding each vertex of the superpixel border that was not in said known border (Γ) to said set (Γ);

g) determining the next superpixel whose border is to be encoded according to said common rule, if any;

i) repeating steps a)-g) until the borders of all the superpixels of the image have being added to said known border (Γ).

2. The method according to claim 1, wherein initially said set of known borders comprises only the external contour of the image, whose vertices are ordered according to said common criterion and said common rule.

3. The method according to claim 1, wherein said common criterion is the relative position of said first vertex within the overall border of the superpixel.

4. The method according to claim 1, wherein the steps c) and d) are not performed for each second vertex of the superpixel border.

5. The method according to claim 1, wherein a further different symbol ("3") is selected for encoding all the next remaining vertices of the current border if the previously encoded vertex is comprised in said set (Γ) and the number of vertices pertaining to the border still to be encoded is greater than two.

6. The method according to claim 1, wherein at step d) said symbol ("1"; "2") different from the first one ("0") is selected based on the fact that the previously encoded vertex pertains or not to said set (Γ).

7. The method according to claim 6, wherein step d) comprises:
   d1) selecting said symbol ("1"; "2") different from the first one ("0") according to a known border encoding technique if the previously encoded vertex is not in said set (Γ), and
   d2) selecting such different symbol ("1"; "2") according to rules different from those of said known border encoding technique otherwise.

8. A method for reconstructing the borders of pixel regions (superpixels) of an image basing on the decoding of a received sequence of symbols, wherein the borders contain a sequence of vertices subdividing the image into superpixels, comprising:
   defining a first vertex for coding said superpixel according to a criterion common to all superpixels;
   defining for each superpixel the same decoding order for reconstructing the border vertices, either clockwise or counter-clockwise;
   defining the order for decoding the superpixels on the base of a common rule depending on the relative positions of said first vertices;
   defining a set of vertices as a known border (Γ),
   wherein the following steps are performed for reconstructing the borders of the superpixels:
   a) determining as first vertex of the current border to be reconstructed the vertex individuated by said common criterion;
   b) reading the next symbol of the received sequence;
   c) adding to the current border the next vertex pertaining to said set (Γ) if said symbol is equal to a first symbol ("0");
   d) adding to the current border a vertex not pertaining to said set (Γ) if said symbol is not equal to a first symbol ("0");
   e) repeating steps b), c), d) and e) until the entire border of the superpixel has been reconstructed;

f) adding each vertex of the superpixel border that was not in said set (Γ) to said known border (Γ);

h) determining the next superpixel whose border is to be reconstructed according to said common rule, if any;

i) repeating steps a)-h) until the all the symbols of the sequence have been read.

9. The method according to claim 8, wherein initially said set (Γ) comprises only the external contour of the image, whose vertices are ordered according to said common criterion and said common rule.

10. The method according to claim 8 or 9, wherein said common criterion is the relative position of said first vertex within the overall border of the superpixel.

11. The method according to claim 8, wherein, for adding the second vertex of a superpixel border, step b) and d) are not performed and step c) is replaced by adding to the current border the next vertex pertaining to said set (Γ).

12. The method according to claim 8, wherein the vertex added at step d) depends on the fact that the vertex added previously pertains or not to the said set (Γ).

13. The method according to claim 12, wherein step d) comprises:
   d1) adding a vertex by reversing the rules of a known border encoding technique if the vertex previously added does not pertain to said set (Γ);
   d2) adding a vertex in according to rules different from those of said known border encoding technique otherwise.

14. The method according to claim 8, wherein if said read symbol is equal to a further different symbol ("3"), a further step g) is performed before step h) comprising:
   adding from said set (Γ) all the remaining vertices of the current superpixel until reaching said first vertex.

15. A computer program product which can be loaded into the memory of a digital processing device, and which comprises portions of software code for executing the method according claim 1.

16. An image processing apparatus comprising a processing unit as well as a memory unit, an input interface and an output interface operatively coupled to said processing unit, wherein:
   the input interface is configured to receive an image segmented into a plurality of pixel regions (superpixel);
   the processing unit is configured to read said segmented image by means of said input interface and to produce on said output interface a sequence of symbols representing an encoding of the borders of said superpixel by executing a set of instructions stored in said memory unit performing the method according to claim 1.

17. An image processing apparatus comprising a processing unit as well as a memory unit, an input interface and an output interface operatively coupled to said processing unit, wherein:
   the input interface is configured to receive a symbol sequence representing, in encoded form, a set of borders of pixel regions (superpixels) individuating a segmentation of an image;
   the processing unit is configured to read said symbol sequence by means of said input interface and to produce on said output interface the image segmentation, reconstructing the borders of the superpixels by executing a set of instructions stored in said memory unit performing the method according to claim 8.

* * * * *